(12) United States Patent
Kagata et al.

(10) Patent No.: US 9,536,944 B2
(45) Date of Patent: Jan. 3, 2017

(54) SEMICONDUCTOR DEVICE AND METHOD OF MANUFACTURING SAME

(71) Applicant: DENSO CORPORATION, Kariya, Aichi-pref. (JP)

(72) Inventors: Yuma Kagata, Kariya (JP); Nozomu Akagai, Nukata-gun (JP); Keita Hayashi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/647,187

(22) PCT Filed: Nov. 26, 2013

(86) PCT No.: PCT/JP2013/006922
§ 371 (c)(1),
(2) Date: May 26, 2015

(87) PCT Pub. No.: WO2014/087600
PCT Pub. Date: Jun. 12, 2014

(65) Prior Publication Data
US 2015/0295028 A1 Oct. 15, 2015

(30) Foreign Application Priority Data

Dec. 4, 2012 (JP) ................................. 2012-265310
Dec. 4, 2012 (JP) ................................. 2012-265311
(Continued)

(51) Int. Cl.
*H01L 21/265* (2006.01)
*H01L 29/06* (2006.01)
(Continued)

(52) U.S. Cl.
CPC ....... *H01L 29/0634* (2013.01); *H01L 21/2251* (2013.01); *H01L 21/26513* (2013.01);
(Continued)

(58) Field of Classification Search
CPC .... H01L 29/0634; H01L 29/417; H01L 29/76; H01L 29/7811; H01L 29/7813; H01L 29/861; H01L 29/0696; H01L 29/41741; H01L 29/1095; H01L 21/26513; H01L 21/324; H01L 21/2251; H01L 23/62; H01L 29/66734; H01L 29/0619; H01L 29/402; H01L 29/4238; H01L 29/0615; H01L 29/0653; H01L 29/41766; H01L 29/66712; H01L 29/066; H01L 29/7802; H01L 29/0646; H01L 29/404; H01L 29/66666; H01L 29/06; H01L 29/0623; H01L 29/063; H01L 29/78; H01L 21/2256; H01L 31/062; H01L 31/113; H01L 31/119
(Continued)

(56) References Cited

U.S. PATENT DOCUMENTS 6,825,537 B2 * 11/2004 Iwamoto ............. H01L 29/0634
257/329
7,465,990 B2 * 12/2008 Yamauchi ........... H01L 29/0634
257/328
(Continued)

FOREIGN PATENT DOCUMENTS

JP S60-249367 A 12/1985
JP H05-291580 A 11/1993
(Continued)

OTHER PUBLICATIONS

Final Office Action mailed Mar. 3, 2015 issued in corresponding JP patent application No. 2013-214758 (and English translation).
(Continued)

*Primary Examiner* — Julia Slutsker
*Assistant Examiner* — Natalia Gondarenko
(74) *Attorney, Agent, or Firm* — Posz Law Group, PLC

(57) ABSTRACT

A semiconductor device has a deep layer with a higher impurity concentration than that of a super junction structure. The deep layer is formed from a position deeper from a surface of a semiconductor layer by a predetermined depth, and comes in contact with a high impurity layer and also comes in contact with the super junction structure. The deep layer overlaps with a portion between a first end which is an outermost peripheral side of a portion that comes in contact with the high impurity layer in a front surface electrode and an end on an outer peripheral side in the high impurity layer when viewed from a substrate normal direction.

23 Claims, 35 Drawing Sheets

(30) Foreign Application Priority Data

Oct. 15, 2013 (JP) ................................. 2013-214758
Oct. 15, 2013 (JP) ................................. 2013-214759

(51) Int. Cl.
| | |
|---|---|
| *H01L 29/861* | (2006.01) |
| *H01L 29/66* | (2006.01) |
| *H01L 29/78* | (2006.01) |
| *H01L 29/10* | (2006.01) |
| *H01L 21/225* | (2006.01) |
| *H01L 21/324* | (2006.01) |
| *H01L 29/417* | (2006.01) |
| *H01L 21/38* | (2006.01) |

(52) U.S. Cl.
CPC ........ *H01L 21/324* (2013.01); *H01L 29/0615* (2013.01); *H01L 29/0619* (2013.01); *H01L 29/0696* (2013.01); *H01L 29/1095* (2013.01); *H01L 29/417* (2013.01); *H01L 29/41741* (2013.01); *H01L 29/66734* (2013.01); *H01L 29/7811* (2013.01); *H01L 29/7813* (2013.01); *H01L 29/861* (2013.01); *H01L 29/8611* (2013.01)

(58) Field of Classification Search
USPC .......................................... 257/329–334, 409
See application file for complete search history.

(56) References Cited

U.S. PATENT DOCUMENTS

| | | | | |
|---|---|---|---|---|
| 2002/0074596 | A1* | 6/2002 | Suzuki | ................ H01L 29/0634 257/330 |
| 2002/0140027 | A1* | 10/2002 | Mo | ..................... H01L 29/0696 257/330 |
| 2003/0222327 | A1 | 12/2003 | Yamaguchi et al. | |
| 2004/0135228 | A1 | 7/2004 | Iwamoto et al. | |
| 2005/0280086 | A1 | 12/2005 | Saito et al. | |
| 2006/0220156 | A1 | 10/2006 | Saito et al. | |
| 2007/0057321 | A1* | 3/2007 | Kikuchi | ............. H01L 29/0619 257/327 |
| 2007/0228462 | A1 | 10/2007 | Saito | |
| 2007/0272979 | A1 | 11/2007 | Saito et al. | |
| 2008/0001217 | A1 | 1/2008 | Kawashima | |
| 2008/0001221 | A1* | 1/2008 | Yoshimura | .......... H01L 29/0696 257/331 |
| 2011/0215418 | A1 | 9/2011 | Saito et al. | |
| 2012/0007173 | A1 | 1/2012 | Yamamoto et al. | |
| 2012/0273875 | A1* | 11/2012 | Yedinak | ................ H01L 29/402 257/330 |

FOREIGN PATENT DOCUMENTS

| | | |
|---|---|---|
| JP | 2007-281034 A | 10/2007 |
| JP | 2010-153622 A | 7/2010 |
| JP | 2011-181805 A | 9/2011 |

OTHER PUBLICATIONS

Report of reconsideration by examiner before appeal mailed Jul. 27, 2015 issued in corresponding JP patent application No. 2013-214758 (and English translation).
International Search Report and Written Opinion of the International Searching Authority dated Jan. 21, 2014 issued in the corresponding International application No. PCT/JP2013/006922 (and English translation).
Office Action mailed Dec. 16, 2014 issued in corresponding JP patent application No. 2013-214758 (and English translation).
Office Action mailed Dec. 16, 2014 issued in corresponding JP patent application No. 2013-214759 (and English translation).

\* cited by examiner

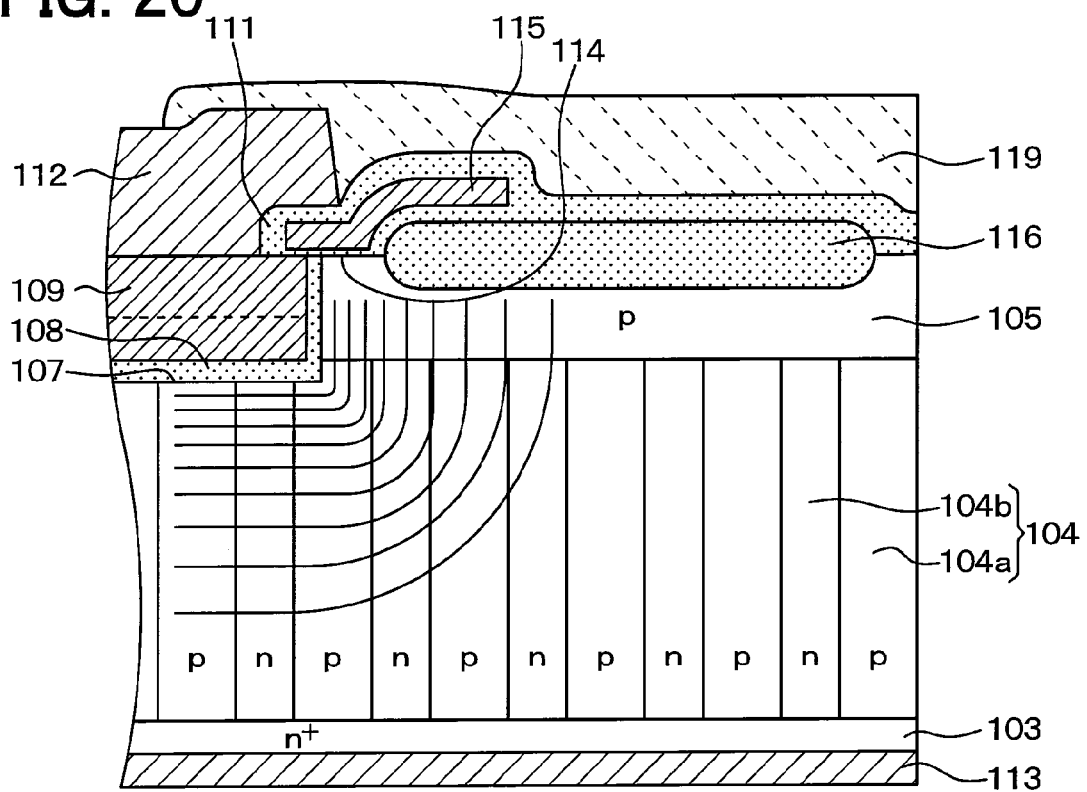
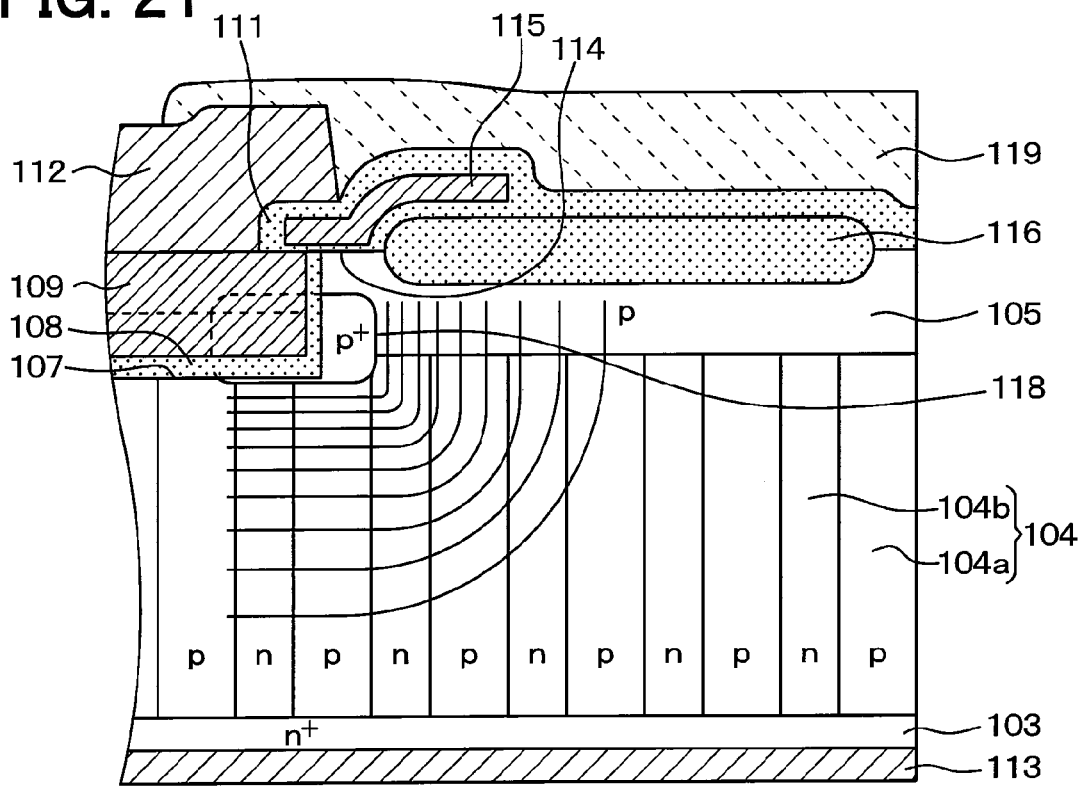

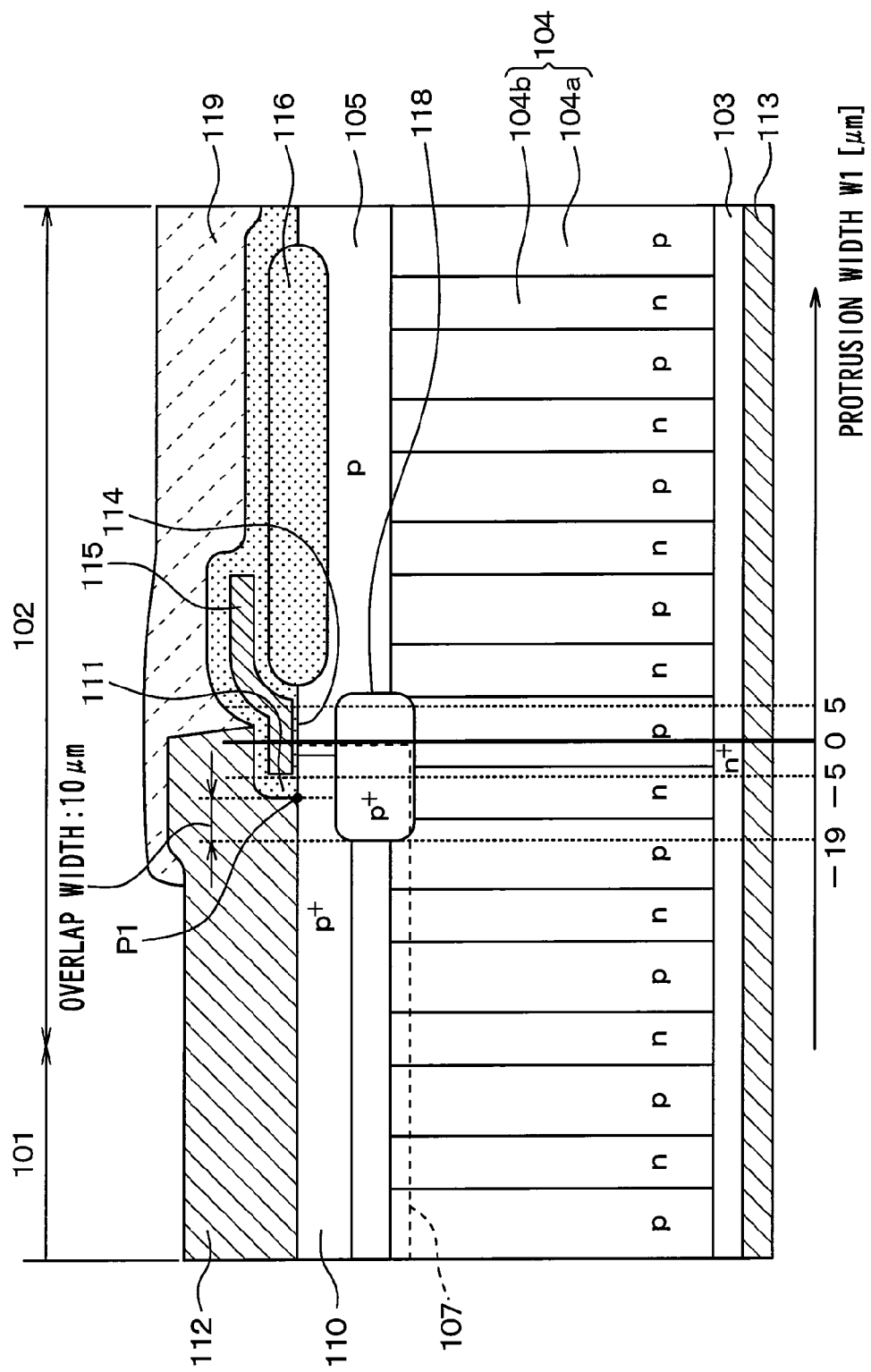

SEMICONDUCTOR DEVICE AND METHOD OF MANUFACTURING SAME

CROSS REFERENCE TO RELATED APPLICATION

This present disclosure is a U.S. national stage of International Application No. PCT/JP2013/006922 filed on Nov. 26, 2013 and is based on and claims priority to Japanese Patent Application No. 2012-265310 filed Dec. 4, 2012, Japanese Patent Application No. 2012-265311 filed Dec. 4, 2012, Japanese Patent Application No. 2013-214758 filed Oct. 15, 2013 and Japanese Patent Application No. 2013-214759 filed Oct. 15, 2013, the contents of which are incorporated herein by reference.

TECHNICAL FIELD

The present disclosure relates to a semiconductor device having a super junction (hereinafter referred to as "SJ") structure, and a method of manufacturing the same.

BACKGROUND ART

In some of semiconductor devices in which a double-diffused MOSFET (DMOS) of a vertical structure is formed in a cell region, a high breakdown voltage layer in an outer peripheral region that surrounds an outer periphery of the cell region is formed of only an n⁻ type epitaxial layer with a low impurity concentration. In the semiconductor device of this type, injected charge (injected carriers) is discharged linearly from the n⁻ type epitaxial layer toward a contact portion with a source electrode in a p type body layer in the recovery operation of the DMOS.

In another semiconductor device in which a DMOS of a vertical structure is formed in a cell region, a high breakdown voltage structure of an outer peripheral region located at an outer periphery of the cell region is formed of a p type surface field relaxation (resurf) layer relatively high in concentration to ensure a high breakdown voltage in the p type resurf layer. Thus, when the DMOS formed in the cell region has a trench gate type, an end of the trench gate on a most outer peripheral side is covered with the p type resurf layer.

On the other hand, in a semiconductor device in which a MOSFET of an SJ structure is formed in a cell region, as with the cell region in which the MOSFET is formed, a high breakdown voltage layer of an outer peripheral region is also formed of a PN column in which p type columns and n type columns are alternatively repeated (for example, refer to PTL 1 and PTL 2). Thus, in the recovery operation of the MOSFET of the SJ structure, an injected charge is discharged toward a contact portion with a source electrode in a p type body layer through the PN columns. In the outer peripheral region in which the SJ structure is provided, the high breakdown voltage can be held in the SJ structure. Therefore, the p type resurf layer provided in the outer peripheral region also has no need to be high in concentration, and the trench gate is not also covered with the p type resurf layer.

PRIOR ART LITERATURES

Patent Literature

PTL 1: JP 2006-278826 A (corresponding to US 2006/0220156A1)

PTL 2: JP 2004-134597 A (corresponding to U.S. Pat. No. 6,825,537B2)

SUMMARY OF INVENTION

Technical Problem

As described above, in the DMOS, the injected charge is discharged linearly from the n⁻ type epitaxial layer toward the contact portion with the source electrode in the p type body layer in the recovery operation. Accordingly, the injected charge is discharged without been relatively concentrated.

However, in the MOSFET of the SJ structure, the injected charge is discharged toward the contact portion with the source electrode in the p type body layer through the PN columns in the recovery operation, and preferably drifts in the p type semiconductor. Thus, as indicated by arrows in FIG. 33, the injected charge goes through p type columns J2 toward a substrate surface side without going over n type columns J1, and is discharged from a contact portion with a source electrode J5 in a p type body layer J4 through a p type resurf layer J3 in the outer peripheral region. Therefore, in the MOSFET of the SJ structure, the injected charge is likely to be concentrated more than the DMOS, resulting in such a problem that a boundary position between the p type body layer J4 and the source electrode J5, or a gate insulating film J7 below a gate line J6 is damaged. In particular, heat generation becomes large in an end of the contact portion of the source electrode J5 with the p type body layer J4 on a most outer peripheral side thereof, and the end is liable to be damaged.

In this example, the MOSFET of the SJ structure is described. However, the same problem arises in a diode of the vertical SJ structure.

Solution to Problem

An object of the present disclosure is to provide a semiconductor device having an SJ structure which is capable of suppressing the damage of an element with the relaxation of the concentration of injected charge. Another object of the present disclosure is to provide a method of manufacturing the semiconductor device.

A semiconductor device according to a first aspect of the present disclosure includes a semiconductor substrate of a first conductivity type, a super junction structure, a semiconductor layer, a high impurity layer of a second conductivity type, a front surface electrode, a rear surface electrode, and a deep layer of the second conductivity type.

The semiconductor substrate has a front surface and a rear surface. The super junction structure has a repetitive structure in which first conductivity type columns and second conductivity type columns are repeated in parallel to a surface of the semiconductor substrate, on the front surface side of the semiconductor substrate. The semiconductor layer is formed on the super junction structure in a cell region and an outer peripheral region assuming that an outer peripheral side of the semiconductor substrate is the outer peripheral region, and an inside of the outer peripheral region is the cell region in which a vertical semiconductor element is formed.

The high impurity layer is formed in the semiconductor layer on the super junction structure in the cell region, and has a higher impurity concentration than that of the semiconductor layer. The front surface electrode is formed to enter the outer peripheral region from the cell region, and is formed in contact with the high impurity layer. The rear surface electrode is electrically connected to the rear surface side of the semiconductor substrate.

The deep layer has a higher impurity concentration than that of the super junction structure, is formed from a position having a predetermined depth from the surface of the semiconductor layer, comes in contact with the high impurity layer and also comes in contact with the super junction structure, and is formed to overlap with a portion between a first end of a portion of the front surface electrode which comes in contact with the high impurity layer on the most outer peripheral side and an end of the high impurity layer on the outer peripheral side when viewed from a substrate normal direction.

The semiconductor device according to the first aspect includes a deep layer that comes in contact with the high impurity layer and the super junction structure, overlaps with a portion between the first end and the end of the high impurity layer when viewed from the substrate normal direction, and is higher in second conductivity type impurity concentration than the SJ structure. With the above configuration, the semiconductor device can relax the concentration of the injected charge to suppress the damage of the element.

In one example of the method of manufacturing the semiconductor device according to the first aspect, the semiconductor substrate is prepared, the super junction structure having the first conductivity type columns and the second conductivity type columns is formed on the front surface side of the semiconductor substrate, an impurity implantation layer is formed in a surface layer portion of the super junction structure by ion-implanting a second conductivity type impurity using a mask in which a region where the deep layer is to be formed is opened, and the deep layer is formed by epitaxially growing the second conductivity type layer on the surface of the super junction structure in which the impurity implantation layer is formed, and thermally diffusing the impurity in the impurity implantation layer through a heat treatment.

As described above, when the impurity implantation layer is formed in the surface layer portion of the super junction structure, high acceleration ion implantation may not be performed. As a result, throughput can be improved, and a manufacturing process can be simplified.

In another example of the method of manufacturing the semiconductor device according to the first aspect, the semiconductor substrate is prepared, the super junction structure having the first conductivity type columns and the second conductivity type columns is formed on the front surface side of the semiconductor substrate, the second conductivity type layer is formed on the surface of the super junction structure, and the deep layer is formed by conducting high acceleration ion implantation with the second conductivity type impurity from above the second conductivity type layer using a mask in which a region where the deep layer is to be formed is opened.

As described above, the high acceleration ion implantation can be conducted with the second conductivity type impurity from above the second conductivity type layer. In that case, because no epitaxial growth is conducted on the surface where a crystal defect occurs by the ion implantation, the semiconductor element more excellent in crystalline can be obtained.

A semiconductor device according to a second aspect of the present disclosure includes a semiconductor substrate of a first conductivity type, a super junction structure, a semiconductor layer, a source region of the first conductivity type, a gate insulating film, a gate electrode, a high impurity layer of a second conductivity type, a front surface electrode, a rear surface electrode, and a deep layer of the second conductivity type.

The semiconductor substrate has a front surface and a rear surface. The super junction structure has a repetitive structure in which first conductivity type columns and second conductivity type columns are repeated in one direction parallel to a surface of the semiconductor substrate, on the front surface side of the semiconductor substrate. The semiconductor layer is formed on the super junction structure in a cell region and an outer peripheral region assuming that an outer peripheral side of the semiconductor substrate is the outer peripheral region, and an inside of the outer peripheral region is the cell region in which a vertical semiconductor element is formed.

The source region is formed in a surface layer portion of the semiconductor layer in the cell region. The gate insulating film reaches the first conductivity type columns through the source region and the semiconductor layer, and is formed on a surface of a trench extending from the cell region toward the outer peripheral region with one direction as a longitudinal direction. The gate electrode is formed on a surface of the gate insulating film in the trench.

The high impurity layer is formed in the semiconductor layer in the cell region, and has a higher impurity concentration than that of the super junction structure. The front surface electrode configures a source electrode that is formed to enter the outer peripheral region from the cell region, and is formed in contact with the high impurity layer and the source region. The rear surface electrode configures a drain electrode that is electrically connected to the rear surface side of the semiconductor substrate.

The deep layer comes in contact with the high impurity layer, has a higher impurity concentration than that of the super junction structure, covers at least a corner of a leading end of the trench in a longitudinal direction of the trench, and protrudes toward an outer peripheral side than the leading end of the trench when viewed from the substrate normal direction.

In the semiconductor device according to the second aspect, because the deep layer is provided, the deep layer becomes substantially the same source potential as that of the front surface electrode through the high impurity layer when the injected charge is withdrawn in the recovery operation. Accordingly, equipotential lines can spread along the deep layer. As a result, a potential applied into the gate insulating film of the trench gate leading end covered with the deep layer can be reduced to relax the electric field concentration, and the gate insulating film can be restricted from being damaged.

In one example of the method of manufacturing the semiconductor device according to the second aspect, the semiconductor substrate is prepared, the super junction structure having the first conductivity type columns and the second conductivity type columns is formed on the front surface side of the semiconductor substrate, an impurity implantation layer is formed in a surface layer portion of the super junction structure by ion-implanting a second conductivity type impurity using a mask in which a region where the deep layer is to be formed is opened, and the deep layer is formed by epitaxially growing the semiconductor layer on the surface of the super junction structure in which the impurity implantation layer is formed, and thermally diffusing the impurity in the impurity implantation layer through a heat treatment.

As described above, when the impurity implantation layer is formed in the surface layer portion of the super junction structure, high acceleration ion implantation may not be performed. As a result, throughput can be improved, and a manufacturing process can be simplified.

In another example of the method of manufacturing the semiconductor device according to the second aspect, the semiconductor substrate is prepared, the super junction structure having the first conductivity type columns and the second conductivity type columns is formed on the front surface side of the semiconductor substrate, the semiconductor layer is formed on the surface of the super junction structure, and the deep layer is formed by conducting high acceleration ion implantation with the second conductivity type impurity from above the second conductivity type layer using a mask in which a region where the deep layer is to be formed is opened.

As described above, the high acceleration ion implantation can be conducted with the second conductivity type impurity from above the second conductivity type layer. In that case, because no epitaxial growth is conducted on the surface where a crystal defect occurs by the ion implantation, the semiconductor element more excellent in crystalline can be obtained.

BRIEF DESCRIPTION OF DRAWINGS

The above and other objects, features and advantages of the present disclosure will become more apparent from the following detailed description made with reference to the accompanying drawings. In the drawings:

FIG. 20 is a cross-sectional view illustrating a potential distribution of the semiconductor device when no p type deep layer is provided;

FIG. 21 is a cross-sectional view illustrating a potential distribution of the semiconductor device when a p type deep layer is provided;

FIG. 22 is a diagram illustrating a protrusion width W1 represented by a distance from a leading end of a trench to an end on an outer peripheral side of the p type deep layer in the cross-section shown in FIG. 17;

EMBODIMENTS FOR CARRYING OUT INVENTION

First Embodiment

A semiconductor device according to a first embodiment of the present disclosure will be described with reference to FIGS. 1 to 4. The semiconductor device illustrated in FIGS. 1 to 4 has a structure in which multiple MOSFETs of an SJ structure are formed as a vertical semiconductor element in a square cell region 1, and an outer peripheral region 2 is arranged around the cell region 1.

Figure 2:
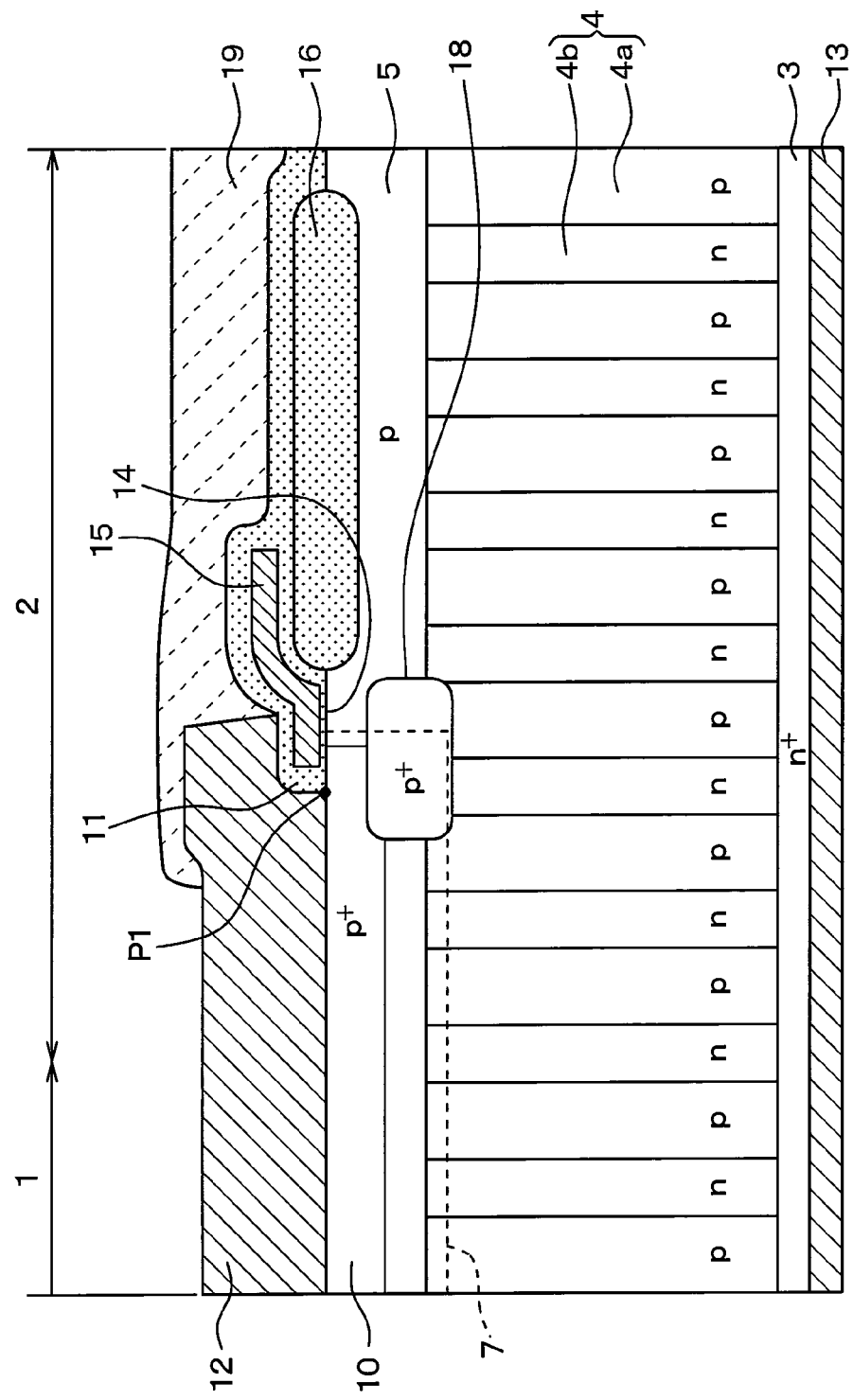
FIG. 2 is a cross-sectional view of the semiconductor device taken along a line II-II shown in FIG. 1.
Figure 3:
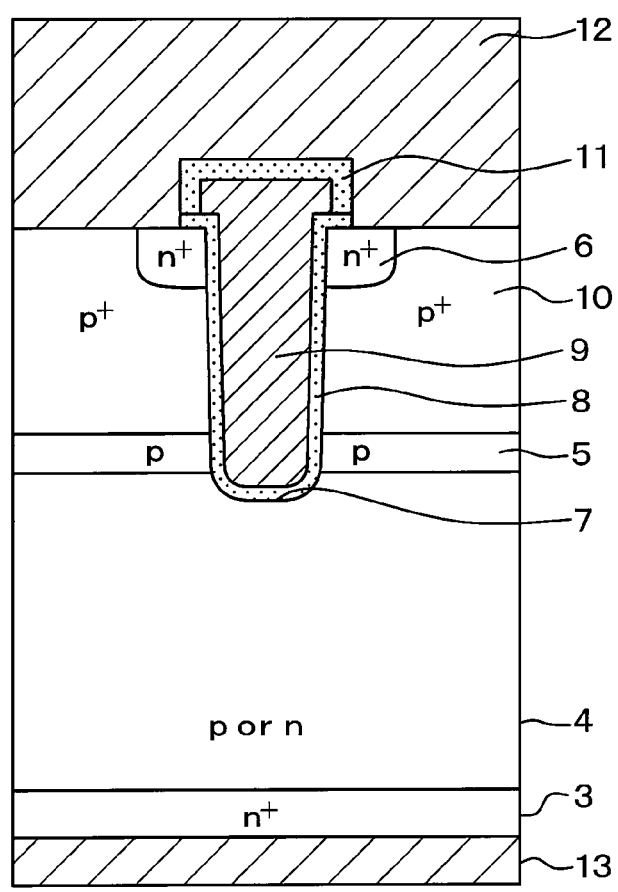
FIG. 3 is a cross-sectional view of the semiconductor device taken along a line shown in FIG. 1.
Figure 4:
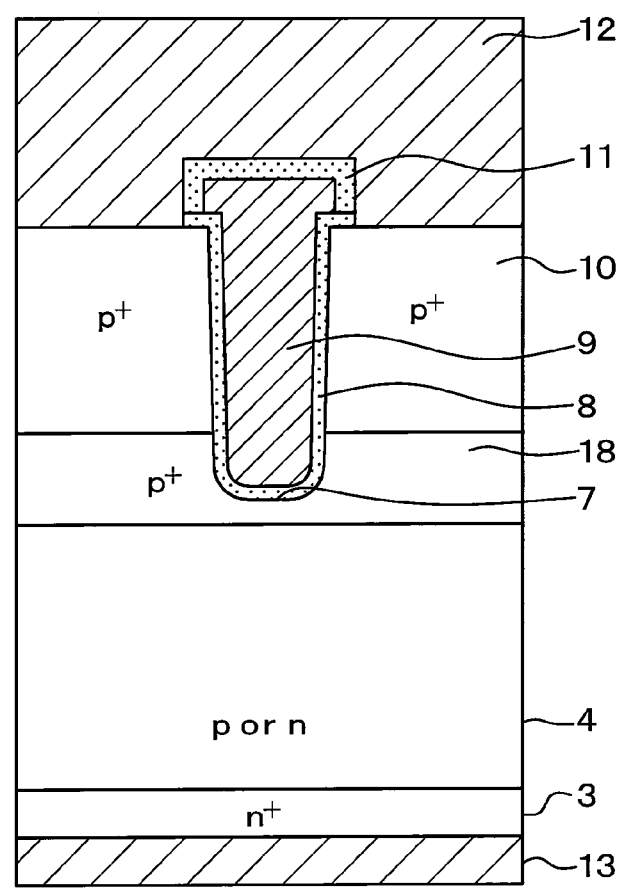
FIG. 4 is a cross-sectional view of the semiconductor device taken along a line IV-IV shown in FIG. 1.

As illustrated in FIGS. 2 to 4, the semiconductor device includes an SJ structure 4 having p type columns 4a and n type columns 4b on a surface of an $n^+$ type substrate 3 made of, for example, silicon, and respective components configuring the MOSFETs are formed on the SJ structure 4. The p type columns 4a and the n type columns 4b have a repetitive structure in which the p type columns 4a and the n type columns 4b are repeated at predetermined pitches and with predetermined widths in one direction parallel to a surface of the $n^+$ type substrate 3. The p type columns 4a and the n type columns 4b are formed on the overall surface of the $n^+$ type substrate 3, that is, are formed in the outer peripheral region 2 in addition to the cell region 1. The p type columns 4a and the n type columns 4b have impurity concentrations, widths, and pitches set taking a charge balance into account. When the p type columns 4a and the n type columns 4b have the same impurity concentration, the p type columns 4a and the n type columns 4b are formed with the same width and at equal pitches. The impurity concentrations of the p type columns 4a and the n type columns 4b are set to, for example, $1 \times 10^{15}$ to $1 \times 10^{16}$ cm$^{-3}$. The $n^+$ type substrate 3 is an example of the semiconductor substrate.

A p type layer 5 formed by epitaxial growth is disposed on the SJ structure 4. The p type layer 5 is formed over the outer peripheral region 2 from the cell region 1, and functions as a resurf layer in the outer peripheral region 2. For example, the impurity concentration of the p type layer 5 is set to $1 \times 10^{15}$ to $5 \times 10^{15}$ cm$^{-3}$, and is set to $3 \times 10^{15}$ cm$^{-3}$ in the present embodiment. The p type layer 5 is an example of the semiconductor layer.

In the cell region 1, trench gate MOSFETs are formed as an example of the MOSFETs having the SJ structure 4. The respective components of the trench gate MOSFETs are configured as follow. That is, as illustrated in FIG. 3, an $n^+$ type source region 6 is formed on a surface layer portion of the p type layer 5 in the cell region 1. The $n^+$ type source region 6 extends in one direction parallel to the surface of the substrate as a longitudinal direction thereof. A trench 7 is formed with the same direction as that of the $n^+$ type source region 6 as a longitudinal direction thereof so as to reach the SJ structure 4 through the $n^+$ type source region 6 and a p type high impurity layer 10 which will be described later. An inner wall surface of the trench 7 is formed with a gate insulating film 8 formed of an oxide film or an ONO film, and a gate electrode 9 is formed on a surface of the gate insulating film 8 so as to be embedded in the trench 7. A trench gate is configured by the above structure. When a gate voltage is applied to the gate electrode 9, a channel is formed in a portion of the p type high impurity layer 10 which comes in contact with a side surface of the trench 7 configuring the trench gate, which is sandwiched between the $n^+$ type source region 6 and the n type columns 4b.

Figure 1:
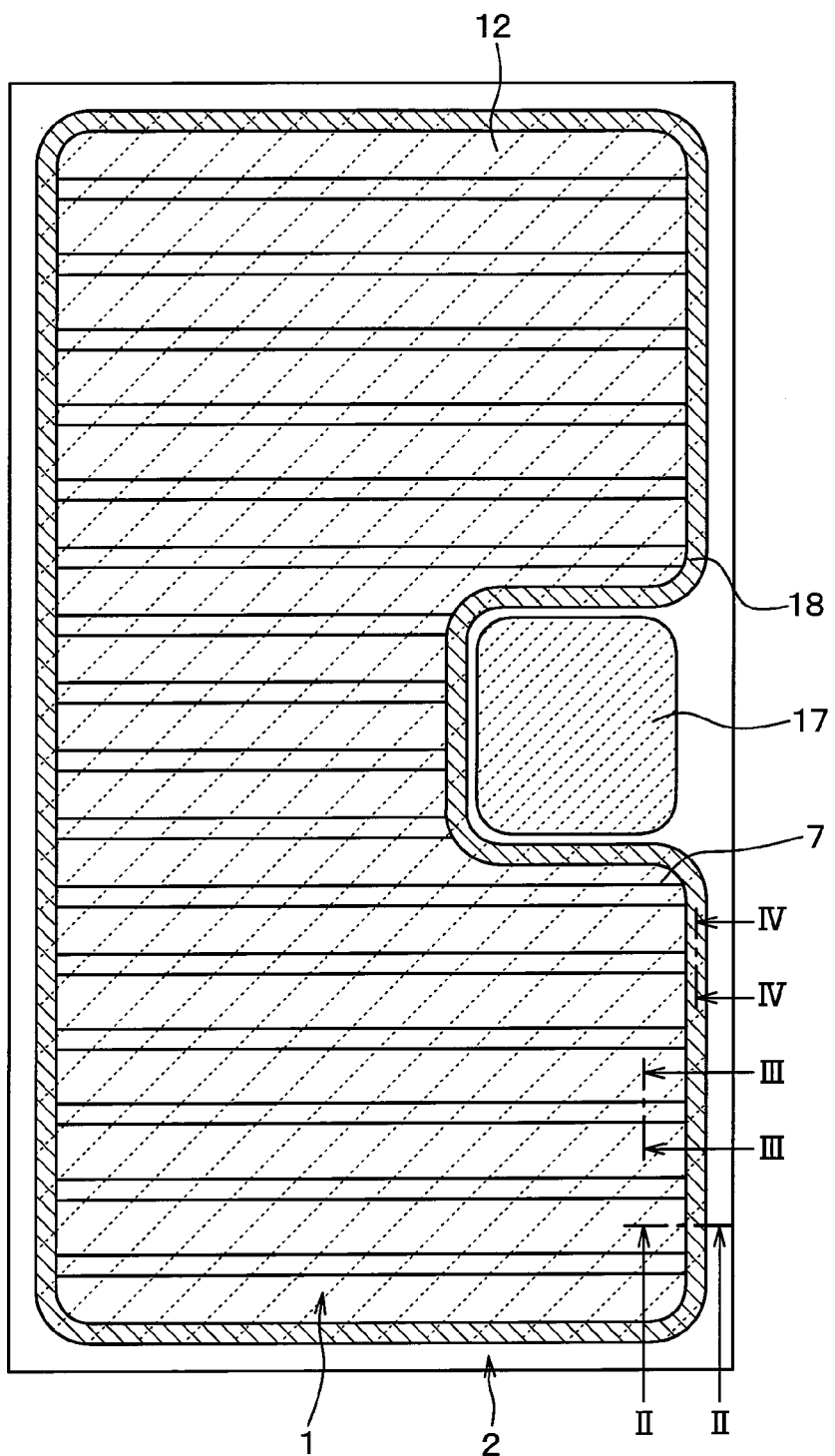
FIG. 1 is a top layout view of a semiconductor device having a MOSFET of an SJ structure according to a first embodiment of the present disclosure.

As illustrated in FIG. 1, a plurality of the trenches 7 is aligned in parallel at equal pitches with one direction as a longitudinal direction thereof. As apparent from FIGS. 2 to 4, in the present embodiment, the trenches 7 are aligned perpendicularly to the longitudinal direction of the p type columns 4a and the n type columns 4b in the SJ structure 4.

In the cell region 1, a p type impurity is ion-implanted into the p type layer 5 to a position having a predetermined depth from the surface of the p type layer 5 to form the p type high impurity layer 10 in which the p type layer 5 becomes higher in concentration. The p type high impurity layer 10 is higher in the impurity concentration than the respective columns configuring the SJ structure 4. For example, the impurity concentration of the p type high impurity layer 10 is set to $1\times10^{17}$ to $1\times10^{18}$ cm$^{-3}$, and is set to $4\times10^{17}$ cm$^{-3}$ in the present embodiment. The p type high impurity layer 10 is an example of the high impurity layer.

The p type high impurity layer 10 functions as a p type body layer, and also functions as a p type channel layer forming a channel of the MOSFETs. The p type body layer and the p type channel layer may be formed through the same ion implantation process, or may be formed through different ion implantation processes. That is, for adjustment of a threshold, a portion of the p type high impurity layer 10 which forms the p type channel layer in which the channel is formed may be formed in an ion implantation process different from that in the portion of the p type body layer, and the respective p type impurity concentrations of the p type channel layer and the p type body layer may be different in value from each other.

The p type high impurity layer 10 is disposed between the respective trenches 7 from the cell region 1 toward the outer peripheral region 2. Specifically, the p type high impurity layer 10 extends with the same direction as the longitudinal direction of the trenches 7 and the n$^+$ type source region 6 as the longitudinal direction. The p type high impurity layer 10 is also formed along the n$^+$ type source region 6, and is terminated in the outer peripheral region 2. In the present embodiment, the trenches 7 and the p type high impurity layer 10 are formed so that positions of both of those leading ends in the longitudinal direction protrude to the outer peripheral region (refer to FIG. 2), and the n$^+$ type source region 6 is formed only in the cell region 1 (refer to FIGS. 3 and 4). Thus, the MOSFETs are configured only in the cell region 1.

An interlayer insulating film 11 having a contact hole which covers the gate electrode 9 and exposes the surfaces of the n$^+$ type source region 6 and the p type high impurity layer 10 is formed on the gate electrode 9. A front surface electrode 12 corresponding to a source electrode is formed to cover the interlayer insulating film 11, and to come in contact with the n$^+$ type source region 6 and the p type high impurity layer 10 through the contact hole of the interlayer insulating film 11. The front surface electrode 12 is formed to enter the outer peripheral region 2 from the cell region 1. The front surface electrode 12 is arranged in a substantially rectangular shape as illustrated in FIG. 1, and one side of the square is partially concaved. An outer edge of the front surface electrode 12 is covered with a protective film 19 to be described later, but a region of the front surface electrode 12 inside of the outer edge is exposed from the protective film 19, and the exposed region functions as a source pad for external connection.

Further, a rear surface side of the n$^+$ type substrate 3, that is, a surface of the n$^+$ type substrate 3 opposite to the SJ structure 4 is formed with a rear surface electrode 13 corresponding to a drain electrode. With the above structure, each of the MOSFETs in the cell region 1 is configured. When a predetermined voltage is applied to the gate electrode 9, the MOSFET structured as described above conducts the operation of forming a channel in the p type layer 5 located on a side surface of the trench 7, and allowing a current to flow between a source and a drain. Because a lower portion of the p type layer 5 has the SJ structure 4, a high breakdown voltage can be obtained while reducing an on-resistance.

On the other hand, in the outer peripheral region 2, a gate line layer 15 is formed through an insulating film 14 at a position of the outer peripheral region 2 on the cell region 1 side, and the gate line layer 15 is electrically connected with gate electrodes 9 of the respective MOSFETs formed in the cell region 1. Also, an insulating film 16 formed of an LOCOS oxide film is formed on the p type layer 5 on an outer peripheral side of the front surface electrode 12 in the outer peripheral region 2, and the insulating film 14 and the gate line layer 15 extend over the insulating film 16 on the outer peripheral side.

The gate line layer 15 is covered with the interlayer insulating film 11, and in a cross-section different from that of FIG. 2, the gate line layer 15 is connected to a gate pad 17 (refer to FIG. 1) formed on the interlayer insulating film 11 through a contact hole formed in the interlayer insulating film 11. The gate pad 17 is arranged in a portion that is partially concaved in the front surface electrode 12 formed in the substantially square shape, and is arranged to be spaced at a predetermined distance from the front surface electrode 12.

The protective film 19 is formed to cover an outer edge of the gate pad 17 and the interlayer insulating film 11 to perform the surface protection of the semiconductor device.

With the above structure, the basic structure of the outer peripheral region 2 is configured. In the present embodiment, a p type deep layer 18 for relaxing the charge concentration is provided in addition to the above basic structure. As illustrated in FIG. 1, the p type deep layer 18 is formed around the outer edge of the front surface electrode 12 when viewed from above (substrate normal direction) of the semiconductor device. In more detail, as illustrated in FIG. 2, the p type deep layer 18 is formed between the p type high impurity layer 10 and the SJ structure 4 so as to come in contact with those components. The feature resides in that a depth of a peak concentration of the p type deep layer 18 is deeper than the depth of the peak concentration of the p type high impurity layer 10. The p type deep layer 18 overlaps with the p type high impurity layer 10 (refer to FIG. 2).

The p type deep layer 18 has a p type impurity concentration set to be at least higher than that of the p type layer 5 (a portion of the p type layer 5 which functions as the resurf layer located in the outer peripheral region 2). Thus, the p type deep layer 18 becomes smaller in the internal resistance than the p type layer 5, and forms a pass route when injected charge that transfers through the p type layer 5 in the outer peripheral region 2 in the recovery operation of the MOSFET transfers to the p type high impurity layer 10, and is discharged to the front surface electrode 12. Because electric charge that has been concentrated on the surface side of the p type layer 5 in the conventional art is captured extensively in a depth direction of the p type deep layer 18, the concentration of the electric charge on the surface side of the p type layer 5 can be suppressed. When the p type deep layer 18 is connected to the front surface electrode 12 not through the p type high impurity layer 10, or when the p type deep layer 18 is formed from the surface thereof, the effect of diverging the electric charge is reduced. It is desirable that the p type deep layer 18 is not depleted. When the p type deep layer 18 is not depleted, not only the effect of dispersing the electric charge is enhanced, but also an electric field of the gate insulating film 8 is suppressed. Therefore, heat generation can be suppressed on the surface side of the p type layer 5, in particular, at an end P1 of the contact portion of the front surface electrode 12 with the p type high impurity layer 10 on the most outer peripheral side thereof, and a damage of a boundary position between the gate insulating film 8 or the front surface electrode 12, and the p type high impurity layer 10 can be suppressed.

The p type deep layer 18 has the p type impurity concentration higher in the impurity concentration than the SJ structure 4 including at least the p type columns 4a and the n type columns 4b. When the p type deep layer 18 is set to be lower in the impurity concentration, an injected charge density exceeds the impurity concentration of the p type deep layer 18, the effect of dispersing the injected charge is reduced, and the recovery capability is reduced. Thus, the p type impurity concentration of the p type deep layer 18 is set to be higher than the impurity concentration of the SJ structure 4.

Further, although the p type deep layer 18 is formed from the position of the predetermined depth, the effect of dispersing the injected charge depends on the depth of the p type deep layer 18. That is, when the depth of the p type deep layer 18 is shallow, the effect of dispersing the injected charge in the depth direction is reduced to cause a reduction in the recovery capability. Thus, the p type deep layer 18 is configured to have the predetermined depth or more.

Figure 5:
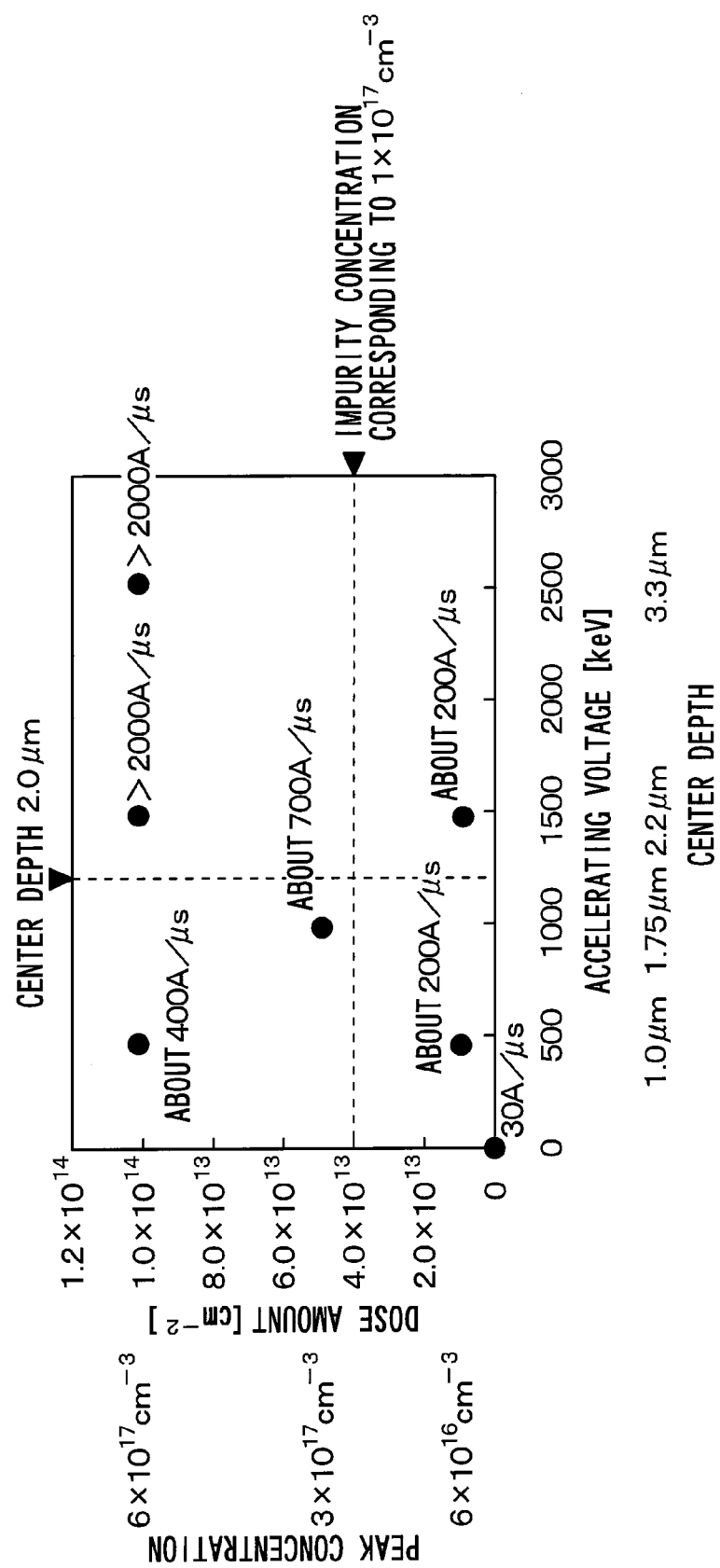
FIG. 5 is a diagram illustrating a relationship of an accelerating voltage, a center depth, a dose amount, and a peak concentration of a p type deep layer, and a recovery capability.

Specifically, with the examination of the recovery capability by adjusting the center depth and the peak concentration of the p type deep layer 18 while changing an accelerating voltage [keV] and the dose amount [$cm^{-2}$], results shown in FIG. 5 are obtained.

As illustrated in the figure, the recovery capability changes depending on the impurity concentration and the center depth of the p type deep layer 18. When the p type deep layer 18 is absent, the recovery capability is 30 A/μs. On the contrary, when the p type deep layer 18 is formed, the recovery capability increases to at least 200 A/μs. When a rated recovery capability is, for example, 300 A/μs or more, if the impurity concentration of the p type deep layer 18 is set to $1\times10^{17}$ $cm^{-3}$ or more, the capability that is equal to or more than the rated recovery capability can be obtained. Further, when the impurity concentration of the p type deep layer 18 is set to $1\times10^{17}$ $cm^{-3}$ or more, and the center depth is set to 2.0 μm or higher, the recovery capability of 1000 A/μs or more can be expected.

Therefore, in the present embodiment, the impurity concentration of the p type deep layer 18 is set to $1\times10^{17}$ $cm^{-3}$ or more, and the center depth of the p type deep layer 18 is set to 2.0 μm or higher so that the recovery capability of 1000 A/μs or more is obtained.

It is desirable that the p type deep layer 18 is set to be lower in the p type impurity concentration than the p type high impurity layer 10. Thus, the electric charge captured in the p type deep layer 18 can transfer in the p type deep layer 18 lower in resistance than the p type layer 5 and higher in resistance than the p type high impurity layer 10, not at a high speed but relatively gently, and arrive in the p type high impurity layer 10. Therefore, as compared with a case in which the electric charge transfers to the p type high impurity layer 10 at a high speed, the concentration of the electric charge on a connection portion between the p type deep layer 18 and the p type high impurity layer 10 can be more relaxed, and the damage on that portion can be suppressed.

As described above, the provision of the p type deep layer 18 makes it possible to relax the concentration of the injected charge in the recovery operation to suppress the damage of the element. The above effects are obtained when the p type deep layer 18 is brought into contact with the p type high impurity layer 10 and the SJ structure 4 while overlapping with the p type high impurity layer 10 when viewed from above the semiconductor device, and the p type impurity concentration is set to be higher than that of the p type layer 5, and lower than that of the p type high impurity layer 10. The magnitude of the above effect changes depending on the positions of the respective ends of the inner and outer peripheries of the p type deep layer 18. Thus, it is preferable to set the positions of the respective ends of the inner and outer peripheries of the p type deep layer 18 on the basis of experimental results which will be described later.

Figure 6:
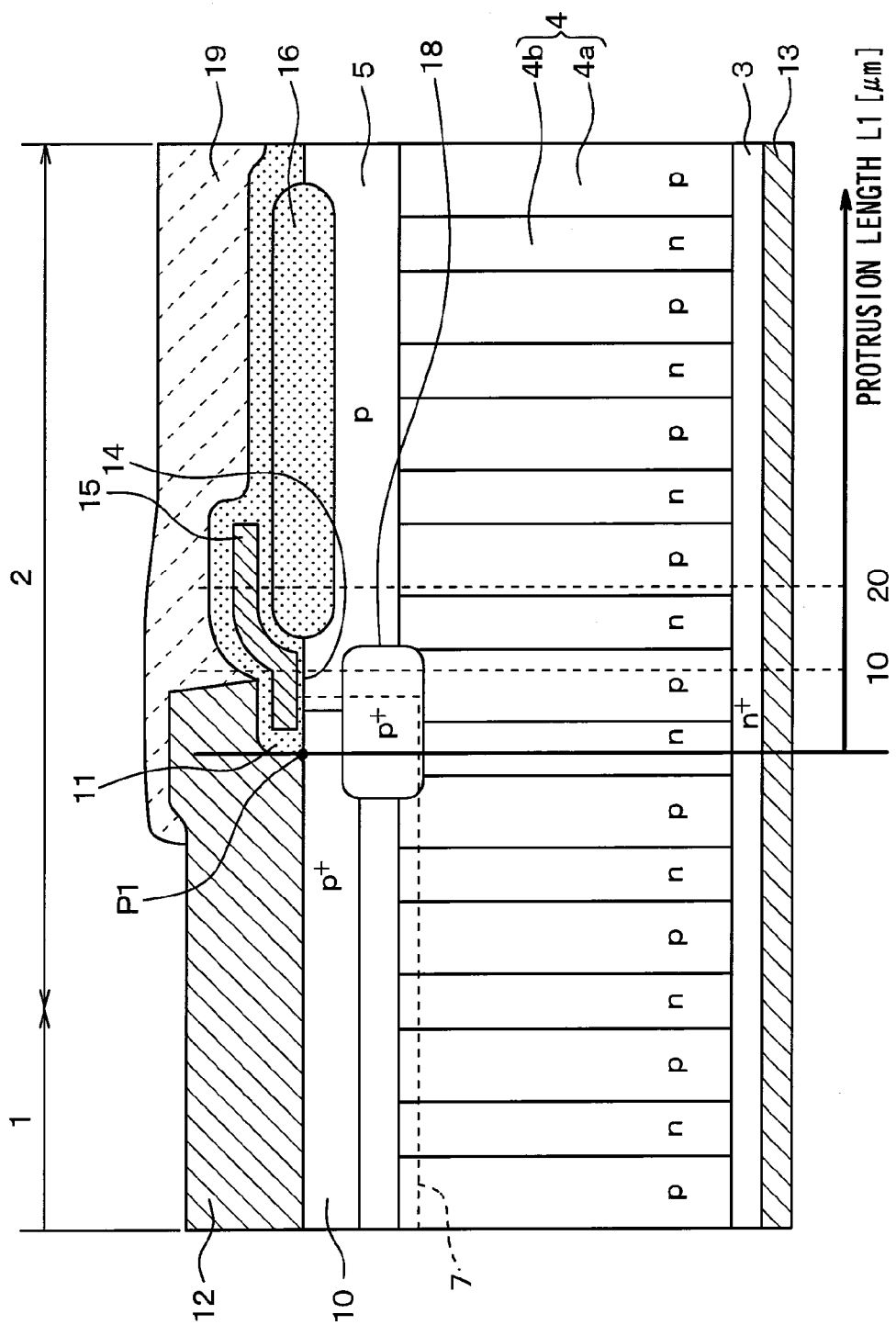
FIG. 6 is a diagram illustrating a protrusion length L1 from an end P1 in a cross-section shown in FIG. 2.
Figure 7:
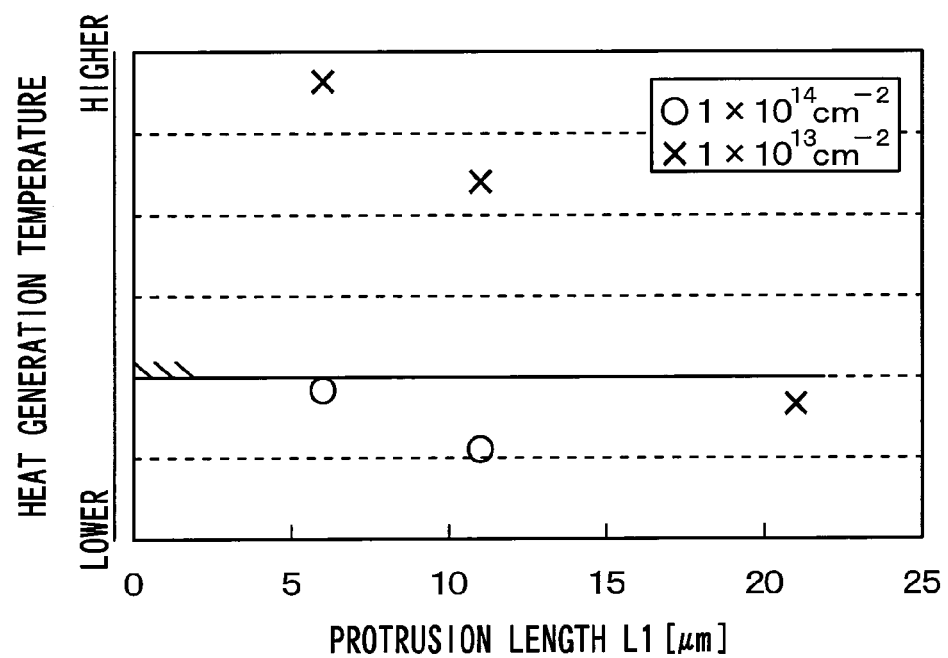
FIG. 7 is a graph showing results obtained by analyzing a heat generation temperature on the end P1 to the protrusion length L1 by simulation.

First, a relationship between the position of the end of the p type deep layer 18 on the outer peripheral side and heat generation will be described with reference to FIGS. 6 and 7.

A location where heat is considered to be most generated in the recovery operation is the end P1 on which the injected charge is considered to be most concentrated. Thus, as illustrated in FIG. 6, a distance from the end P1 to the end of the p type deep layer 18 on the outer peripheral side is defined as a protrusion length L1 [μm], and a relationship between the protrusion length L1 and the heat generation temperature on the end P1 is obtained through simulation with the change in the doze amount (that is, impurity concentration) of the p type deep layer 18. FIG. 7 is a graph showing the results. As illustrated in the figure, the heat generation temperature on the end P1 changes depending on the protrusion length L1, and the heat generation temperature on the end P1 decreases more as the protrusion length L1 becomes larger. When the dose amount of the p type deep layer 18 changes to $1\times10^{13}$ $cm^{-2}$ and $1\times10^{14}$ $cm^{-2}$, the heat generation temperature becomes lower as the dose amount of the p type deep layer 18 is larger. In any of those cases, likewise, there is a tendency that the heat generation temperature becomes lower as the protrusion length L1 is larger.

Therefore, on the end of the p type deep layer 18 on the outer peripheral side, the heat generation temperature can decrease more as the protrusion length L1 from the end P1 is longer, and the damage on the end P1 and in the vicinity of the end P1 can be more suppressed.

When the end of the p type deep layer 18 on the outer peripheral side is located outside of the ends of the front surface electrode 12, the gate pad 17, and the gate line layer 15 on the outer peripheral side, in short, the outermost portion which becomes a ground potential in measuring a drain-source breakdown voltage (breakdown voltage) when viewed from above the semiconductor device, the breakdown voltage is conversely lowered. Thus, it is desirable that the end of the p type deep layer 18 on the outer peripheral side is arranged inside of the end of the outer peripheral side of any one of the front surface electrode 12, the gate pad 17, and the gate line layer 15 which is located on the most outer peripheral side.

If the end of the p type deep layer 18 on the outer peripheral side is arranged inside of the end of the p type high impurity layer 10 when viewed from above the semiconductor device, the injected charge is drawn into not the p type deep layer 18 but the p type high impurity layer 10. Thus, the end of the p type deep layer 18 on the outer peripheral side is arranged outside of at least the end of the p type high impurity layer 10.

Figure 8:
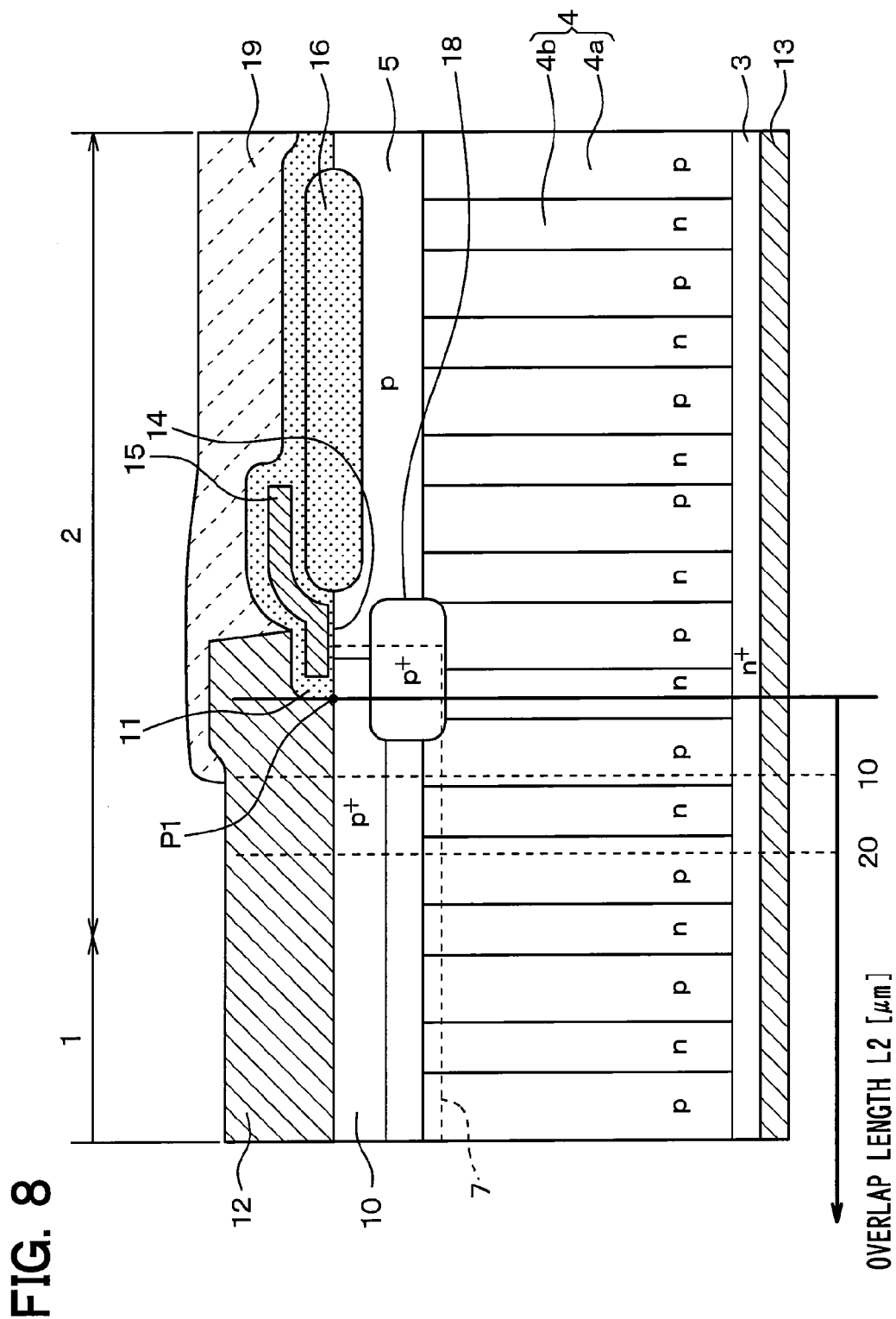
FIG. 8 is a diagram illustrating an overlap length L2 from the end P1 in the cross-section shown in FIG. 2.
Figure 9:
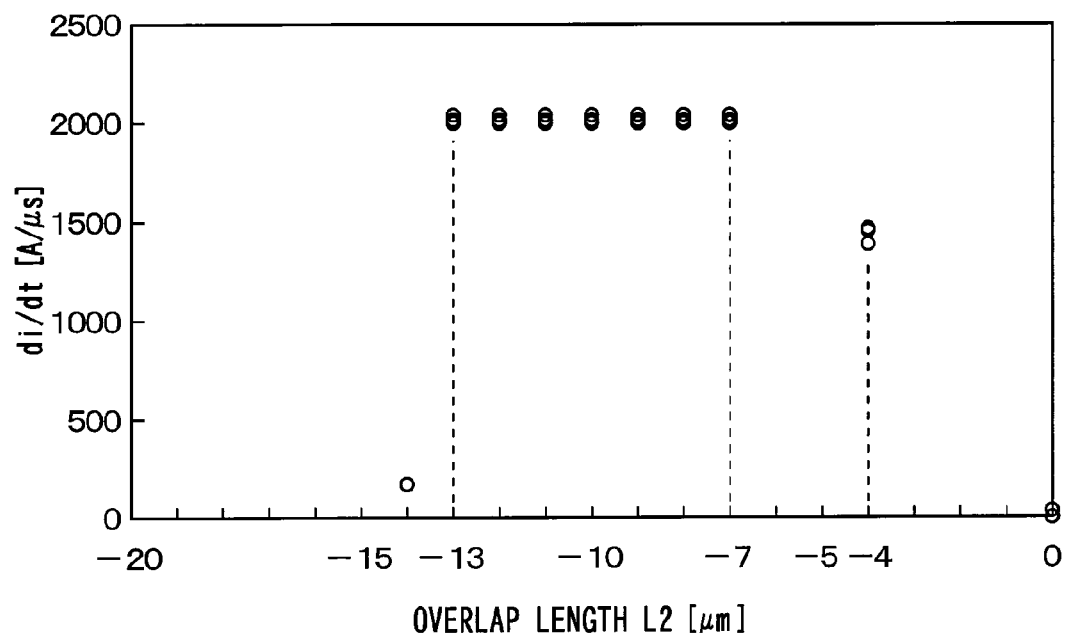
FIG. 9 is a graph showing results obtained by examining the recovery capability to an overlap length L2 by experiment.

Subsequently, a relationship between the position of the end of the p type deep layer 18 on the inner peripheral side and the recovery capability will be described with reference to FIGS. 8 and 9.

As described above, the p type deep layer 18 captures the electric charge extensively in the depth direction, and the electric charge arrives in the p type high impurity layer 10 relatively gently. Thus, the p type deep layer 18 needs to have some degree of concentration and width to get a desired internal resistance. The concentration of the p type deep layer 18 is set to be higher than the p type layer 5, and lower than the p type high impurity layer 10. The width of the p type deep layer 18 is preferable to be set taking the recovery capability into account.

Under the circumstances, a relationship between the width of the p type deep layer 18 and the recovery capability is examined. Specifically, in order to obtain the recovery capability, the end of the p type deep layer 18 on the inner peripheral side needs to be located inside of the end P1 when viewed from above the semiconductor device. Thus, as illustrated in FIG. 8, the amount of overlap of the p type deep layer 18 with the p type high impurity layer 10 from the end of the p type deep layer 18 on the inner peripheral side to the end P1 is defined as an overlap length L2, and a relationship between the overlap length L2 and the recovery capability [A/μs] is obtained by experiment. FIG. 9 is a graph showing the results.

As shown in the figure, the recovery capability changes depending on the overlap length L2. The recovery capability is small when the overlap length L2 is small. Conceivably, this is because a connection of the p type deep layer 18 to the p type high impurity layer 10 becomes small, and the p type deep layer 18 becomes in a floating state which floats from the potential of the front surface electrode 12 to reduce the effect of diffusing the electric charge. That is, when the overlap length L2 is small, and the p type deep layer 18 becomes in the floating state floating from the potential of the front surface electrode 12, the electric charge is discharged directly from the p type high impurity layer 10 without entering the p type deep layer 18 to reduce the recovery capability. On the other hand, the recovery capability becomes largest when the overlap length L2 is 7 to 13 μm, and when the overlap length L2 further increases, the recovery capability is again reduced because resistance components are reduced. The overlap length L2 has an optimum condition as described above. The above experiment is conducted under the condition in which the dose amount of the p type deep layer 18 is $1 \times 10^{14}$ cm$^{-2}$. Even when another concentration is applied, a relationship between the overlap length L2 and a change in the recovery capability is the same as the above relationship. It is found that the high recovery capability is obtained when the overlap length L2 falls within a predetermined range. For example, if the overlap length L2 is set to a range of 4 to 13 μm, the recovery capability becomes 600 A/μs or more.

As described above, when the overlap length L2 is set to the predetermined range, for example, 6 to 12 μm, the high recovery capability can be obtained. The results illustrated in FIG. 9 suggest that the recovery capability is lowered with a structure in which the p type deep layer 18 comes in direct contact with the front surface electrode 12 because the resistance components of the p type deep layer 18 are reduced. Thus, the p type deep layer 18 is connected to the front surface electrode 12 through the p type high impurity layer 10, to thereby suppress a reduction in the recovery capability.

Subsequently, a description will be given of a method of manufacturing the semiconductor device configured as described above according to the present embodiment with reference to FIGS. 10A to 10G. In the semiconductor device of the present embodiment, the longitudinal direction of the p type columns 4a and the n type columns 4b is perpendicular to the longitudinal direction of the trench gate. In this example, for facilitation to understand the manufacturing method, those directions are arranged in parallel in the illustration.

Figure 10A:
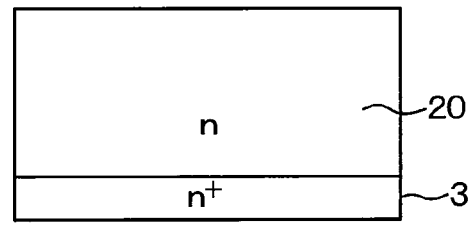
FIG. 10A is a cross-sectional view partially illustrating a process of manufacturing the semiconductor device according to the first embodiment.
Figure 10B:
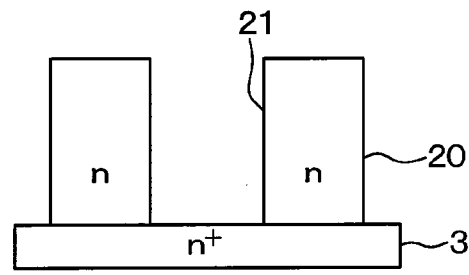
FIG. 10B is a cross-sectional view partially illustrating a process of manufacturing the semiconductor device according to the first embodiment.

First, as illustrated in FIG. 10A, after the n$^+$ type substrate 3 having a front surface and a rear surface is prepared, an n type epitaxial layer 20 is formed on the surface of the n$^+$ type substrate 3. Subsequently, the n type epitaxial layer 20 is etched using a mask in which positions where the p type columns 4a not shown are to be formed are opened. As a result, as illustrated in FIG. 10B, only positions of the n type epitaxial layer 20 where the n type columns 4b are to be formed remain, and trenches 21 are formed at the positions where the p type columns 4a are to be formed. In this situation, the n type epitaxial layer 20 may be etched so that a depth of the trenches 21 becomes as large as a thickness of the n type epitaxial layer 20. Alternatively, the depth of the trenches 21 may be set so that a desired thickness of the n type epitaxial layer 20 remains.

Figure 10C:
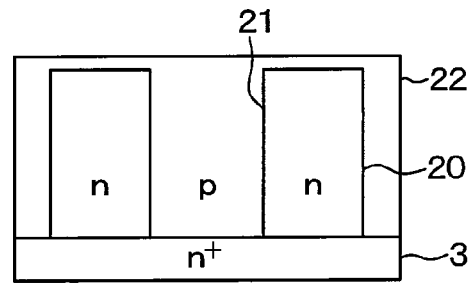
FIG. 10C is a cross-sectional view partially illustrating a process of manufacturing the semiconductor device according to the first embodiment.
Figure 10D:
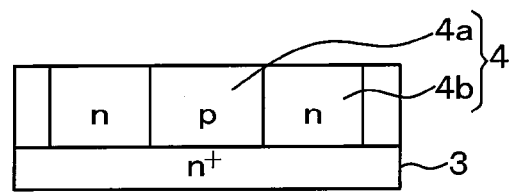
FIG. 10D is a cross-sectional view partially illustrating a process of manufacturing the semiconductor device according to the first embodiment.

Subsequently, as illustrated in FIG. 10C, a p type epitaxial layer 22 is formed on the n type epitaxial layer 20 so as to be embedded in the trenches 21. Further, as illustrated in FIG. 10D, planarization polishing is performed to remove the n type epitaxial layer 20 and the p type epitaxial layer 22 by a predetermined amount. As a result, the n type columns 4b are configured by the n type epitaxial layer 20, and the p type columns 4a are configured by the p type epitaxial layer 22 to complete the SJ structure 4.

Figure 10E:
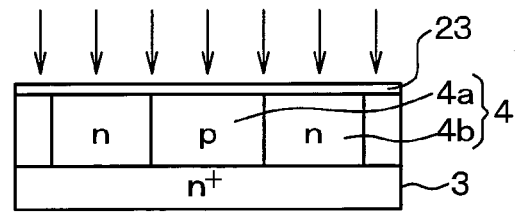
FIG. 10E is a cross-sectional view partially illustrating a process of manufacturing the semiconductor device according to the first embodiment.
Figure 10F:
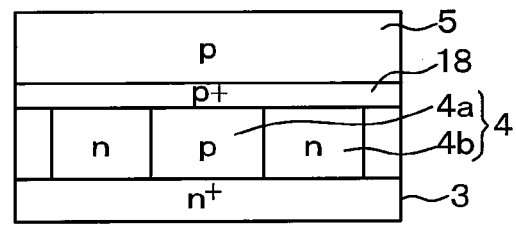
FIG. 10F is a cross-sectional view partially illustrating a process of manufacturing the semiconductor device according to the first embodiment.

Further, after a mask not shown in which a position where the p type deep layer 18 is to be formed is opened is arranged through a photography process, a p type impurity is ion-implanted using that mask. As a result, as illustrated in FIG. 10E, an impurity implantation layer 23 for forming the p type deep layer 18 is formed on surfaces of the p type columns 4a and the n type columns 4b. Further, as illustrated in FIG. 10F, after the p type layer 5 epitaxially grows, and a heat treatment is performed to thermally diffuse the p type impurity in the impurity implantation layer 23 to form the p type deep layer 18 extending from the surface layer portions of the p type columns 4a and the n type columns 4b into the p type layer 5.

Figure 10G:
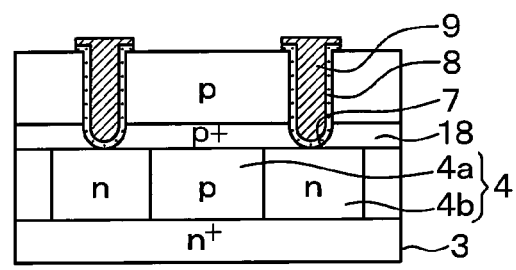
FIG. 10G is a cross-sectional view partially illustrating a process of manufacturing the semiconductor device according to the first embodiment.

Thereafter, as illustrated in FIG. 10G, a semiconductor device having trench gate MOSFETs of the SJ structure is completed through the same manufacturing process of the MOSFETs as the conventional process.

As described above, the p type deep layer 18 is disposed to come in contact with the p type high impurity layer 10 and the SJ structure 4, and overlap with a portion between the end P1 and the end of the p type high impurity layer 10 when viewed from above the semiconductor device. The p type impurity concentration of the p type deep layer 18 is set to be higher than that of the p type layer 5, and lower than that of the p type high impurity layer 10. The provision of the p type deep layer 18 described above makes it possible to relax the concentration of the injected charge (injected carrier) in the recovery operation to suppress the damage of the element.

Second Embodiment

A second embodiment of the present disclosure will be described. In the present embodiment, the method of manufacturing the semiconductor device is changed as compared with the first embodiment, and other configurations are identical with those in the first embodiment. Therefore, only parts different from those in the first embodiment will be described.

Figure 11A:
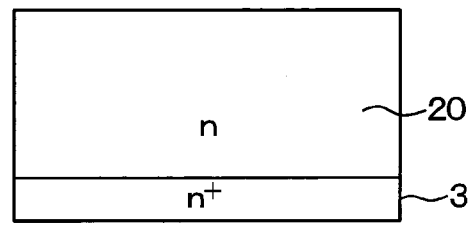
FIG. 11A is a cross-sectional view partially illustrating a process of manufacturing the semiconductor device according to a second embodiment of the present disclosure.
Figure 11B:
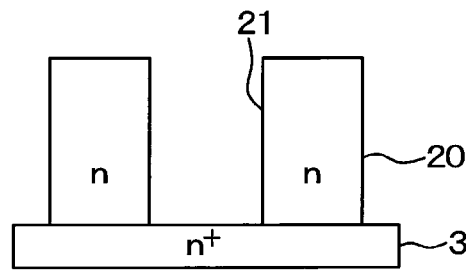
FIG. 11B is a cross-sectional view partially illustrating a process of manufacturing the semiconductor device according to the second embodiment.
Figure 11C:
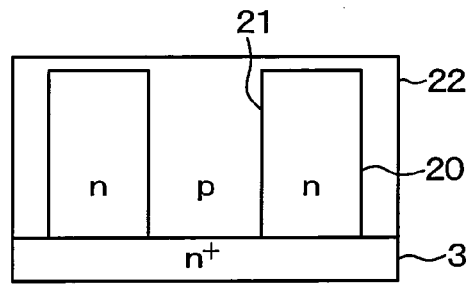
FIG. 11C is a cross-sectional view partially illustrating a process of manufacturing the semiconductor device according to the second embodiment.
Figure 11D:
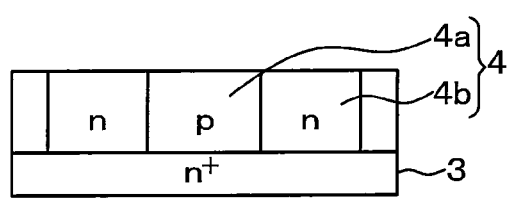
FIG. 11D is a cross-sectional view partially illustrating a process of manufacturing the semiconductor device according to the second embodiment.
Figure 11E:
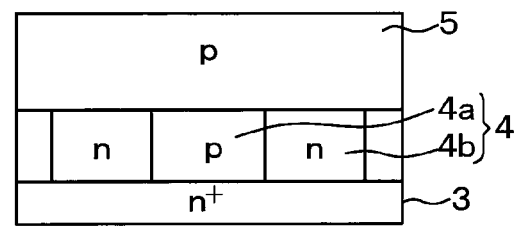
FIG. 11E is a cross-sectional view partially illustrating a process of manufacturing the semiconductor device according to the second embodiment.
Figure 11F:
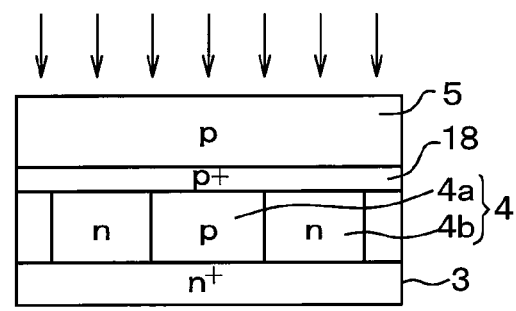
FIG. 11F is a cross-sectional view partially illustrating a process of manufacturing the semiconductor device according to the second embodiment.
Figure 11G:
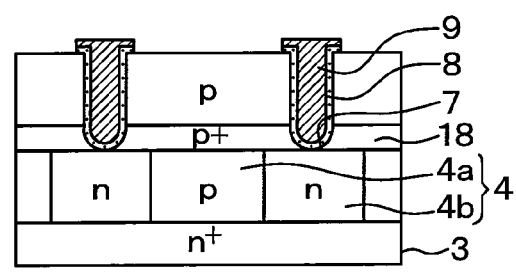
FIG. 11G is a cross-sectional view partially illustrating a process of manufacturing the semiconductor device according to the second embodiment.

A method of manufacturing the semiconductor device according to the present embodiment will be described with reference to FIGS. 11A to 11G. First, in processes illustrated in FIGS. 11A to 11D, the same processes as those in FIGS. 10A to 10D described in the first embodiment are performed. Further, in the process illustrated in FIG. 11E, the p type layer 5 epitaxially grows on the SJ structure 4 before ion implantation of the p type impurity for forming the p type deep layer 18. Thereafter, after a mask not shown in which a position where the p type deep layer 18 is to be formed is opened is arranged through a photography process, a p type impurity is implanted from above the p type layer 5 by high acceleration ion implantation using that mask. With the above process, the p type deep layer 18 is formed as illustrated in FIG. 11F. Thereafter, as illustrated in FIG. 11G, a semiconductor device having trench gate MOSFETs of the SJ structure is completed through the same manufacturing process of the MOSFETs as the conventional process.

As described above, the p type layer 5 epitaxially grows before ion implantation of the p type impurity for forming the p type deep layer 18, and thereafter the p type deep layer 18 can be formed by the high acceleration ion implantation. In the manufacturing method as described above, as compared with the first embodiment, because a device for performing the high acceleration ion implantation is required, the simplification of the manufacturing process attributable to the absence of the high acceleration ion implantation as in the first embodiment cannot be performed. However, because no epitaxial growth is conducted on the surface where a crystal defect occurs due to the ion implantation as in the first embodiment, the resurf layer more excellent in crystalline can be obtained.

In the manufacturing method, the p type deep layer 18 can be formed from the surface of the p type layer 5. However, when the p type deep layer 18 is formed from the surface of the p type layer 5, since a defect is formed to the surface of the p type layer 5, a heat treatment for defect restoration is required. Thus, according to the method of the present embodiment, no heat treatment for forming the p type deep layer 18 is required, and even if the heat treatment is performed, a processing time of the heat treatment can be shortened.

Third Embodiment

A third embodiment of the present disclosure will be described. In the present embodiment, a top layout of the p type deep layer 18 changes in the first embodiment, and other configurations are identical with those in the first embodiment. Therefore, only portions different from those in the first embodiment will be described.

Figure 12:
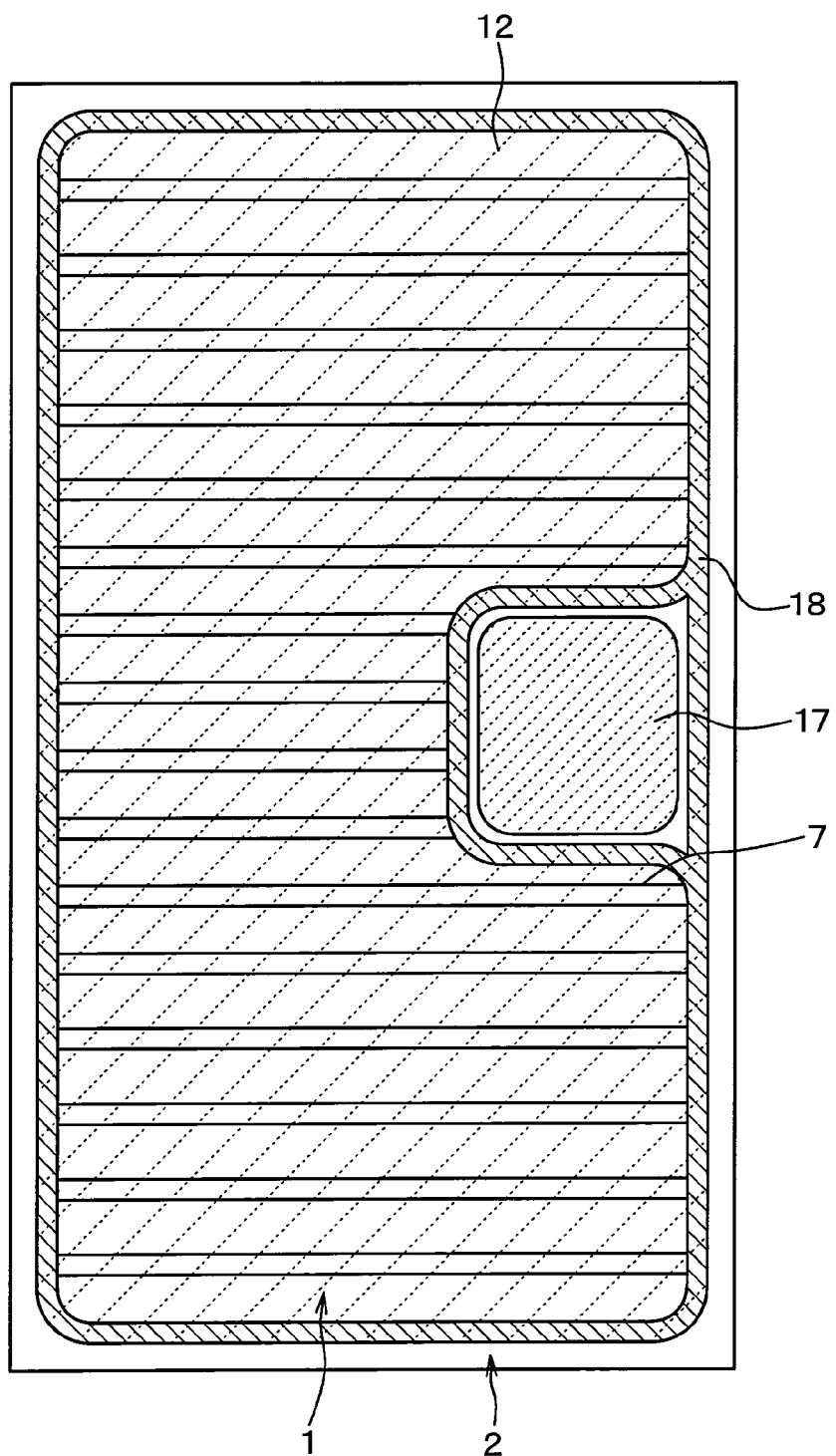
FIG. 12 is a top layout view of a semiconductor device according to a third embodiment of the present disclosure.

The configuration of the semiconductor device according to the present embodiment will be described with reference to FIG. 12. As illustrated in the figure, in the present embodiment, the p type deep layer 18 is formed around the outer edge of the front surface electrode 12. In addition, the p type deep layer 18 is also formed on an outer edge of a side of the gate pad 17 which does not face the front surface electrode 12. In other words, the p type deep layer 18 is formed around the outer edge of the gate pad 17 when viewed from above the semiconductor device.

In order to suppress the damage on the boundary position between the gate insulating film 8 or the front surface electrode 12 and the p type high impurity layer 10, the p type deep layer 18 may be formed around the outer edge of the front surface electrode 12. However, the SJ structure 4 is also configured below the gate pad 17, and the injected charge also transfers from the p type columns 4a located below the gate pad 17 in the recovery operation. Therefore, the p type deep layer 18 is also formed on the outer edge of the side of the gate pad 17 which does not face the front surface electrode 12, thereby being capable of suppressing the concentration of the injected charge with the diffusion of the injected charge present below the gate pad 17 to improve the recovery capability.

Fourth Embodiment

A fourth embodiment of the present disclosure will be described. In the present embodiment, a case of forming not the MOSFET but a diode in the cell region 1 will be described. Even when the diode is formed, because the basic structure of the semiconductor device is similar to that in the case of forming the MOSFET, only portions that are changed as compared with the first embodiment will be described.

Figure 13:
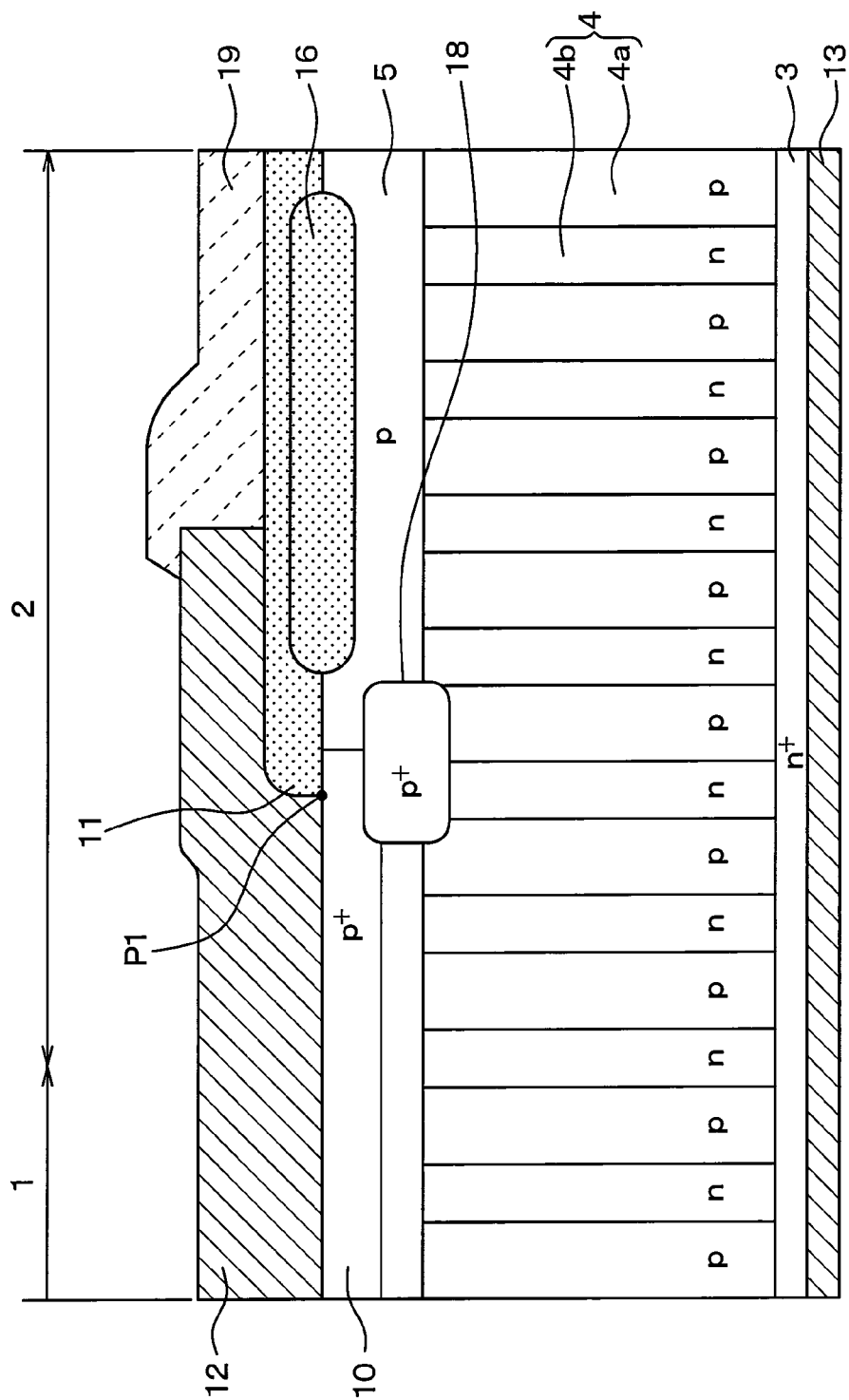
FIG. 13 is a cross-sectional view of a semiconductor device having a diode of an SJ structure according to a fourth embodiment of the present disclosure.

The configuration of the semiconductor device according to the present embodiment will be described with reference to FIG. 13. As illustrated in FIG. 13, in the present embodiment, a pn diode having the p type layer 5 in the cell region 1 as an anode region, the p type high impurity layer 10 as an anode contact, and the n type columns 4b and the n$^+$ type substrate 3 as a cathode region is configured. The front surface electrode 12 functions as an anode electrode that is brought into contact with the p type high impurity layer 10, and an outer edge of the front surface electrode 12 is covered with the protective film 19. An inside of the outer edge in the front surface electrode 12 is exposed, and functions as an anode pad for external connection. The rear surface electrode 13 functions as a cathode electrode. In addition, the present embodiment is different from the first embodiment in that the gate electrode structure, the gate line layer, and the n$^+$ type source region provided in the MOSFET are eliminated. The remaining portions are similar to those in the semiconductor device described in the first embodiment. The semiconductor device having the diode of the SJ structure 4 is configured as described above.

Similarly, the semiconductor device configured as described above includes the p type deep layer 18. Thus, as in the first embodiment, the effects that the concentration of the injected charge in the recovery operation can be relaxed to suppress the damage of the element are obtained.

In the present embodiment, if the p type deep layer 18 overlaps with the portion between the end P1 and the end of the p type high impurity layer 10, the above advantages are obtained. As with the first embodiment, the protrusion length L1 of the p type deep layer 18 can be defined as a distance from the end P1 to the end of the p type deep layer 18 on the outer peripheral side. The heat generation temperature on the end P1 decreases more as the protrusion length L1 is longer, and the effect of the damage suppression is enhanced. On the other hand, the overlap length L2 can be defined by the amount of overlap of the p type deep layer 18 extending an end of the p type deep layer 18 on the inner peripheral side to an end of the p type high impurity layer 10 on the outer peripheral side with the p type high impurity layer 10. The overlap length L2 is set to a desired range, for example, 6 to 12 μm, thereby being capable of obtaining the high recovery capability.

Fifth Embodiment

A fifth embodiment of the present disclosure will be described. In the present embodiment, the gate pad 17 is arranged in the center of the cell region 1. Other configurations are identical with those in the first embodiment, and therefore only parts different from those in the first embodiment will be described.

Figure 14:
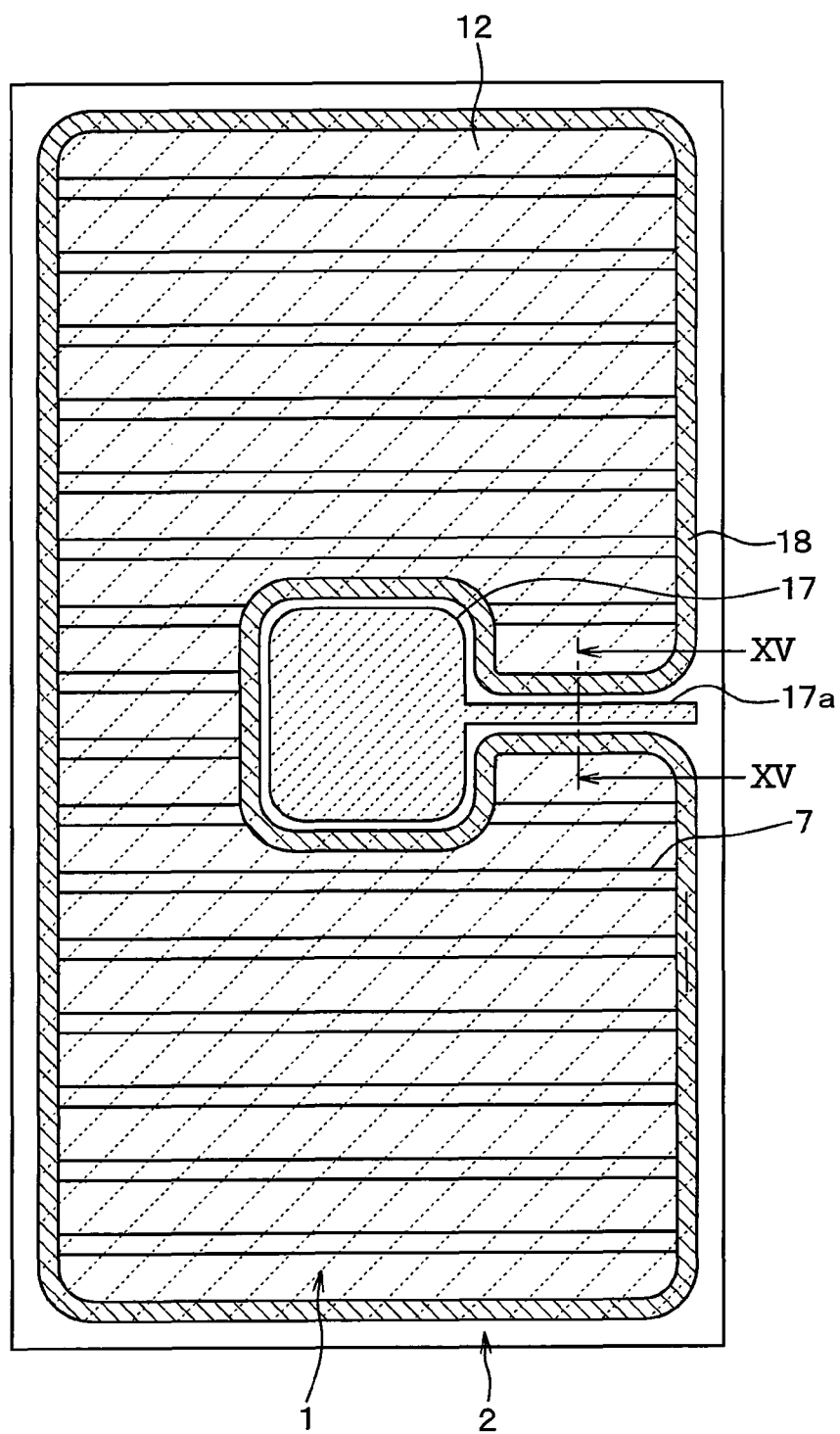
FIG. 14 is a top layout view of a semiconductor device having a MOSFET of an SJ structure according to a fifth embodiment of the present disclosure.
Figure 15:
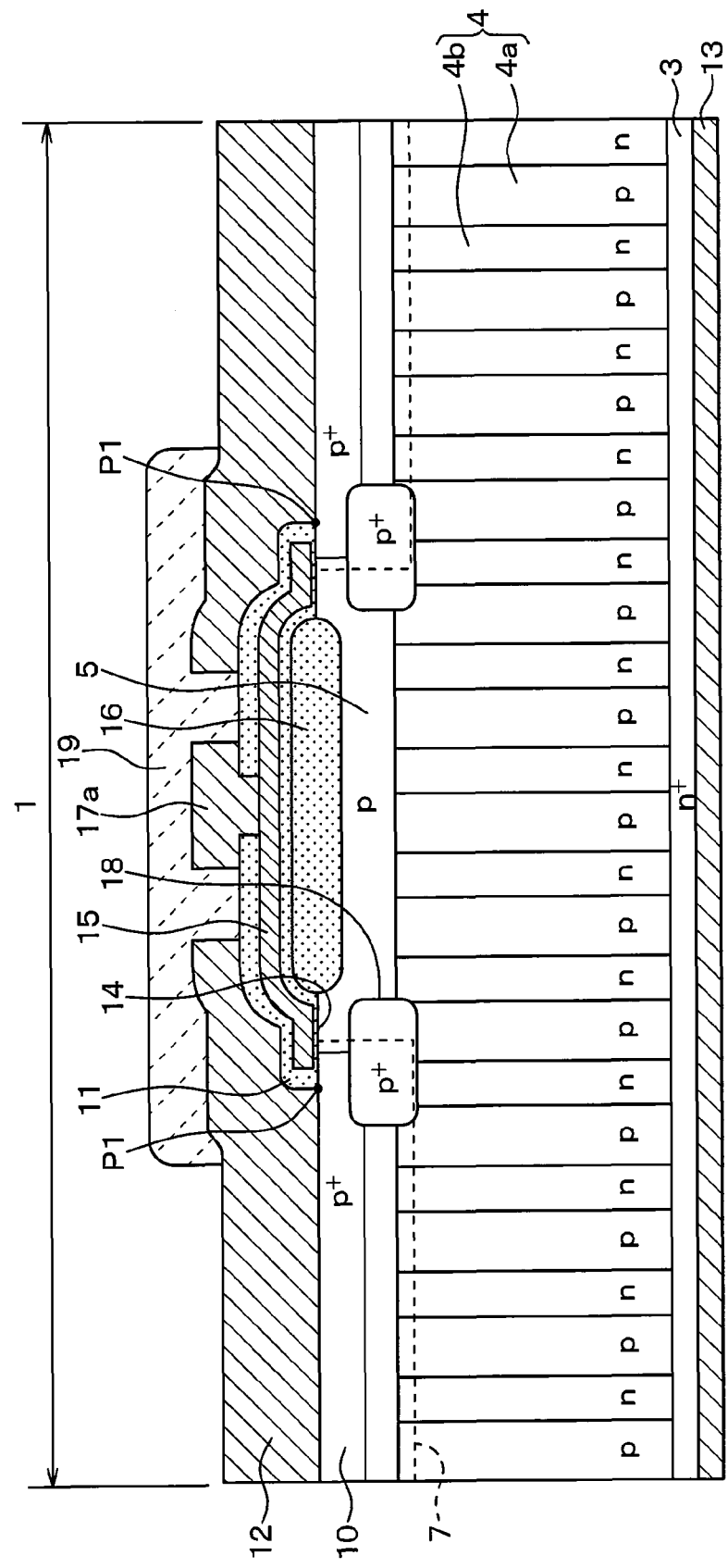
FIG. 15 is a cross-sectional view of the semiconductor device taken along a line XV-XV shown in FIG. 14.

The configuration of the semiconductor device according to the present embodiment will be described with reference to FIGS. 14 and 15. As illustrated in FIG. 14, in the present embodiment, the gate pad 17 is arranged in the center of the cell region 1. In the above structure, the p type high impurity layer 10 is divided in a position at which the gate pad 17 is formed, or a lead wire portion 17a connected to the gate pad 17 when viewed from a substrate normal direction as illustrated in FIG. 14. In other words, the p type high impurity layer 10 is partially notched in the cell region 1. Thus, as illustrated in FIGS. 14 and 15, the p type deep layer 18 is also formed in a portion where the p type high impurity layer 10 is divided.

As described above, in the structure where the p type high impurity layer 10 is divided, the p type deep layer 18 is also formed in the divided portion, thereby being capable of suppressing a reduction in the recovery capability.

Sixth Embodiment

A semiconductor device according to a sixth embodiment of the present disclosure will be described with reference to FIGS. 16 to 19. The semiconductor device illustrated in FIGS. 16 to 19 has a structure in which multiple trench gate MOSFETs of an SJ structure are formed as a vertical semiconductor element in a square cell region 101, and an outer peripheral region 102 is arranged around the cell region 101.

Figure 17:
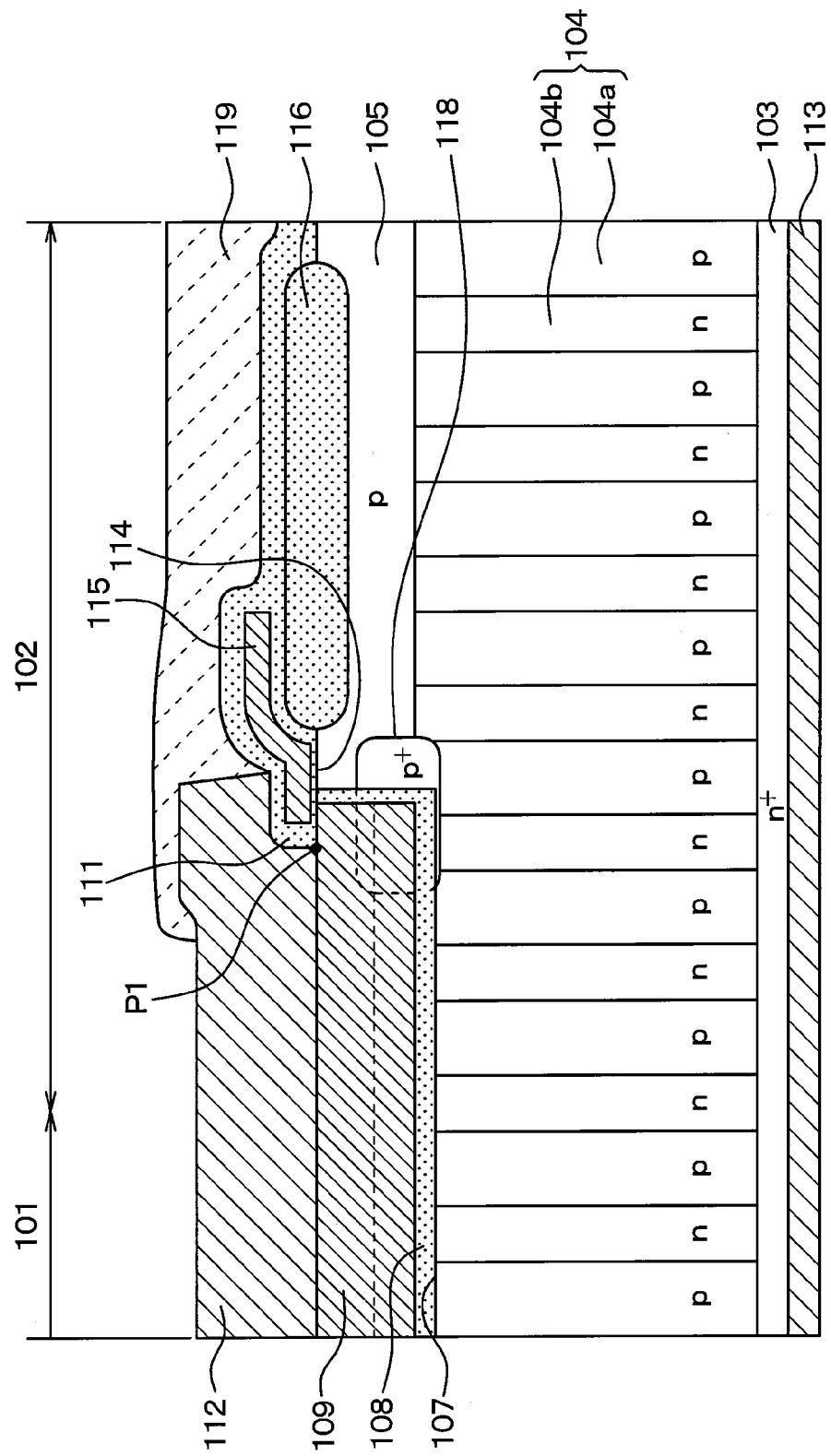
FIG. 17 is a cross-sectional view of the semiconductor device taken along a line XVII-XVII shown in FIG. 16.
Figure 18:
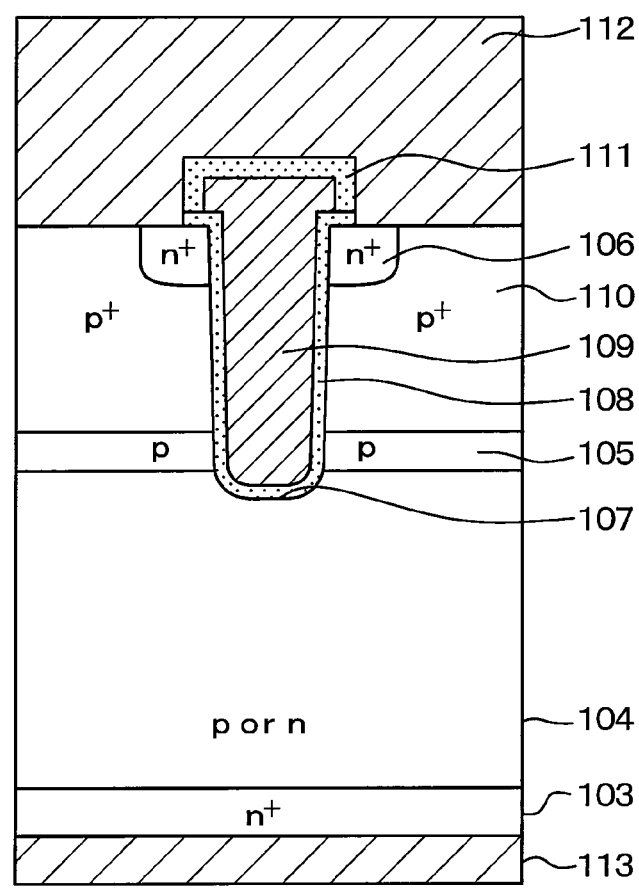
FIG. 18 is a cross-sectional view of the semiconductor device taken along a line XVIII-XVIII shown in FIG. 16.
Figure 19:
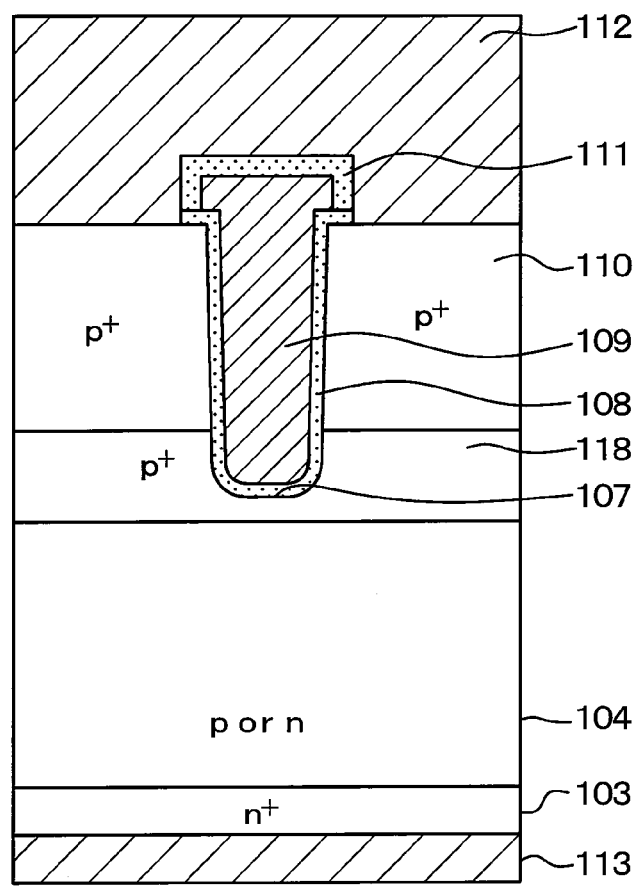
FIG. 19 is a cross-sectional view of the semiconductor device taken along a line XIX-XIX shown in FIG. 16.

As illustrated in FIGS. 17 to 19, the semiconductor device includes an SJ structure 104 having p type columns 104a and n type columns 104b on a surface of an $n^+$ type substrate 103 made of, for example, silicon, and respective components configuring the MOSFETs are formed on the SJ structure 104. The p type columns 104a and the n type columns 104b have a repetitive structure in which the p type columns 104a and the n type columns 104b are repeated at predetermined pitches and with predetermined widths in one direction parallel to a surface of the $n^+$ type substrate 103. The p type columns 104a and the n type columns 104b are formed on the overall surface of the $n^+$ type substrate 103, that is, formed in the outer peripheral region 102 in addition to the cell region 101. The p type columns 104a and the n type columns 104b have impurity concentrations, widths, and pitches set taking a charge balance into account. When the p type columns 104a and the n type columns 104b have the same impurity concentration, the p type columns 104a and the n type columns 104b are formed with the same width and at equal pitches. The impurity concentrations of the p type columns 104a and the n type columns 104b are set to, for example, $1\times10^{15}$ to $1\times10^{16}$ cm$^{-3}$. The $n^+$ type substrate 103 is an example of the semiconductor substrate.

A p type layer 105 formed by epitaxial growth is disposed on the SJ structure 104. The p type layer 105 is formed over the outer peripheral region 102 from the cell region 101, and functions as a resurf layer in the outer peripheral region 102. For example, the impurity concentration of the p type layer 105 is set to $1\times10^{15}$ to $5\times10^{15}$ cm$^{-3}$, and set to $3\times10^{15}$ cm$^{-3}$ in the present embodiment. The p type layer 105 is an example of the semiconductor layer.

In the cell region 101, trench gate MOSFETs having the SJ structure 104 are formed as multiple cells. The respective components of the trench gate MOSFETs are configured as follow. That is, as illustrated in FIG. 18, an $n^+$ type source region 106 is formed on a surface layer portion of the p type layer 105 in the cell region 101. The $n^+$ type source region 106 extends in one direction parallel to the surface of the substrate as a longitudinal direction thereof. A trench 107 is formed with the same direction as that of the $n^+$ type source region 106 as a longitudinal direction thereof so as to reach the SJ structure 104 through the $n^+$ type source region 106 and a p type high impurity layer 110 which will be described later. An inner wall surface of the trench 107 is formed with a gate insulating film 108 formed of an oxide film or an ONO film, and a gate electrode 109 is formed on a surface of the gate insulating film 108 so as to be embedded in the trench 107. A trench gate is configured by the above structure. When a gate voltage is applied to the gate electrode 109, a channel is formed in a portion of the p type high impurity layer 110 which comes in contact with a side surface of the trench 107 configuring the trench gate, which is sandwiched between the $n^+$ type source region 106 and the n type columns 104b.

The concentration of a region in which the channel is formed in the p type high impurity layer 110 may be adjusted by ion implantation of the p type impurity for adjustment of a threshold, and may be different in value in the p type impurity concentration from the other portion of the p type high impurity layer 110.

Figure 16:
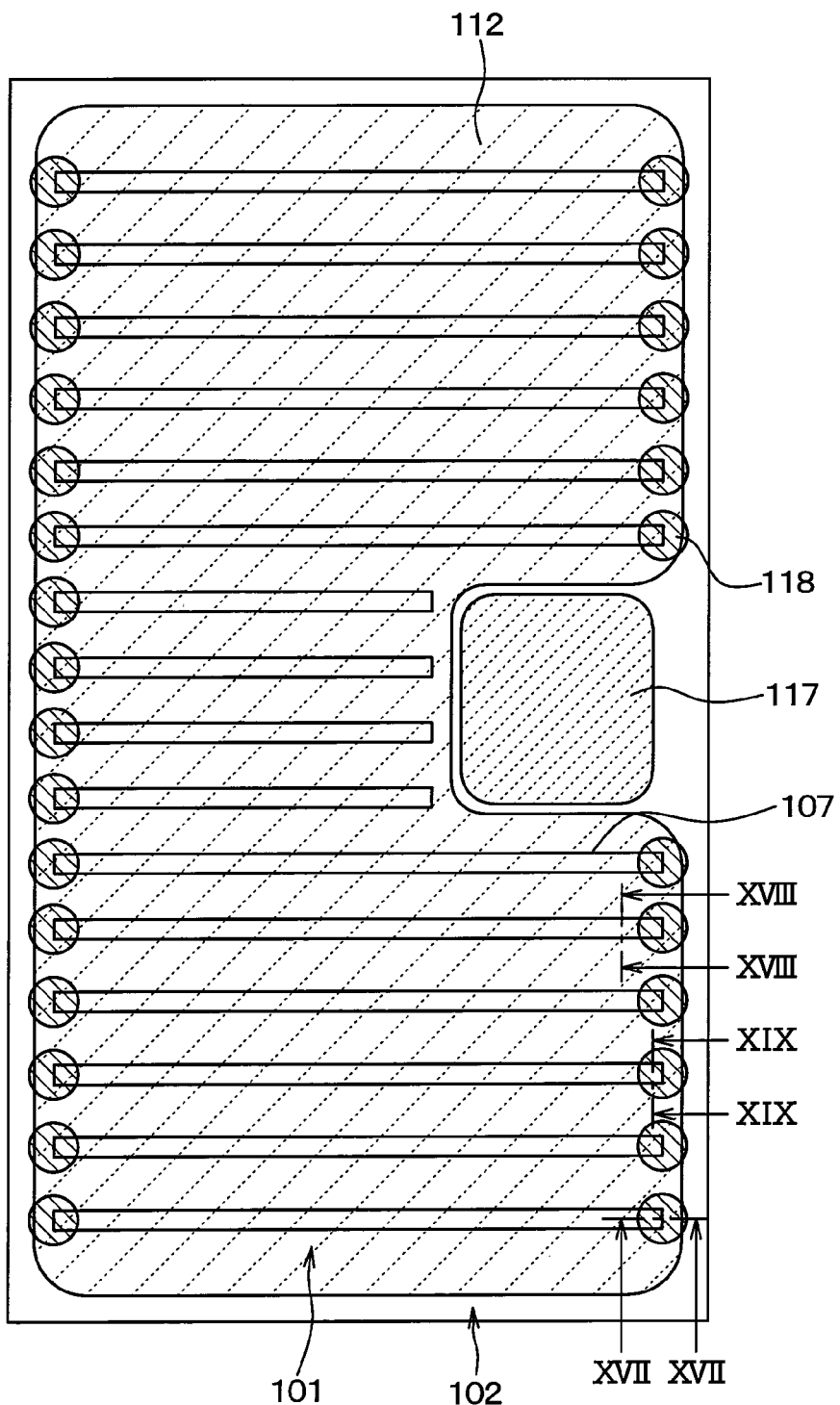
FIG. 16 is a top layout view of a semiconductor device having a MOSFET of an SJ structure according to a sixth embodiment of the present disclosure.

As illustrated in FIG. 16, a plurality of the trenches 107 is aligned in parallel at equal pitches with one direction as a longitudinal direction thereof. As apparent from FIGS. 17 to 19, in the present embodiment, the trenches 107 are aligned perpendicularly to the longitudinal direction of the p type columns 104a and the n type columns 104b in the SJ structure 104.

In the cell region 101, a p type impurity is ion-implanted into the p type layer 105 to a position having a predetermined depth from the surface of the p type layer 105 to form the p type high impurity layer 110 in which the p type layer 105 becomes higher in concentration. The p type high impurity layer 110 is higher in the impurity concentration than the respective columns configuring the SJ structure 104. For example, the impurity concentration of the p type high impurity layer 110 is set to $1\times10^{17}$ to $1\times10^{18}$ cm$^{-3}$, and is set to $4\times10^{17}$ cm$^{-3}$ in the present embodiment.

The p type high impurity layer 110 functions as a p type body layer, and also functions as a p type channel layer forming a channel of the MOSFETs. The p type body layer and the p type channel layer may be formed through the same ion implantation process, or may be formed through different ion implantation processes. That is, for adjustment of a threshold, a portion of the p type high impurity layer 110 which forms the p type channel layer in which the channel is formed may be formed in an ion implantation process different from that in the portion of the p type body layer, and the respective p type impurity concentrations of the p type channel layer and the p type body layer may be different in value from each other.

Specifically, the p type high impurity layer 110 extends with the same direction as the longitudinal direction of the trenches 107 and the $n^+$ type source region 106 as the longitudinal direction. The p type high impurity layer 110 is also formed along the $n^+$ type source region 106, and is terminated in the outer peripheral region 102. In the present embodiment, the trenches 107 and the p type high impurity layer 110 are formed so that positions of both of those leading ends in the longitudinal direction protrude to the outer peripheral region (refer to FIG. 17), and the $n^+$ type source region 106 is formed only in the cell region 101 (refer to FIGS. 18 and 19). Thus, the MOSFETs are configured only in the cell region 101.

An interlayer insulating film 111 having a contact hole which covers the gate electrode 109 and exposes the surfaces of the n+ type source region 106 and the p type high impurity layer 110 is formed on the gate electrode 109. A front surface electrode 112 corresponding to a source electrode is formed to cover the interlayer insulating film 111, and to come in contact with the n+ type source region 106 and the p type high impurity layer 110 through the contact hole of the interlayer insulating film 111. The front surface electrode 112 is formed to enter the outer peripheral region 102 from the cell region 101. The front surface electrode 112 is arranged in a substantially rectangular shape as illustrated in FIG. 16, and one side of the square is partially concaved. An outer edge of the front surface electrode 112 is covered with a protective film 119 to be described later, but a region of the front surface electrode 112 inside of the outer edge is exposed from the protective film 119, and the exposed region functions as a source pad for external connection.

Further, a rear surface side of the n+ type substrate 103, that is, a surface of the n+ type substrate 103 opposite to the SJ structure 104 is formed with a rear surface electrode 113 corresponding to a drain electrode. With the above structure, each of the MOSFETs in the cell region 101 is configured. When a predetermined voltage is applied to the gate electrode 109, the MOSFET structured as described above conducts the operation of forming a channel in the p type layer 105 located on a side surface of the trench 107, and allowing a current to flow between a source and a drain. Because a lower portion of the p type layer 105 has the SJ structure 104, a breakdown voltage can be obtained while reducing an on-resistance.

On the other hand, in the outer peripheral region 102, a gate line layer 115 is formed through an insulating film 114 at a position of the outer peripheral region 102 on the cell region 101 side, and the gate line layer 115 is electrically connected with gate electrodes 109 of the respective MOSFETs formed in the cell region 101. Also, an insulating film 116 formed of an LOCOS oxide film is formed on the p type layer 105 on an outer peripheral side of the front surface electrode 112 in the outer peripheral region 102, and the insulating film 114 and the gate line layer 115 extend over the insulating film 116 on the outer peripheral side.

The gate line layer 115 is covered with the interlayer insulating film 111, and in a cross-section different from that of FIG. 17, the gate line layer 115 is connected to a gate pad 117 (refer to FIG. 16) formed on the interlayer insulating film 111 through a contact hole formed in the interlayer insulating film 111. The gate pad 117 is arranged in a portion that is partially concaved in the front surface electrode 112 formed in the substantially square shape, and is arranged to be spaced at a predetermined distance from the front surface electrode 112.

The protective film 119 is formed to cover an outer edge of the gate pad 117 and the interlayer insulating film 111 to perform the surface protection of the semiconductor device.

With the above structure, the basic structure of the outer peripheral region 102 is configured. In the present embodiment, the p type deep layer 118 for relaxing the concentration of an electric field applied to the gate insulating film 108 in the trench gate to restrict the gate insulating film 108 from being damaged is provided in addition to the above basic structure.

As illustrated in FIG. 16, the p type deep layer 118 is formed to cover at least corners of leading ends of the respective trenches 107 which protrude to the outer edge of the front surface electrode 112, and is formed into a dot shape for each of the trenches 107 when viewed from above (substrate normal direction) the semiconductor device. In more detail, as illustrated in FIG. 17, the p type deep layer 118 is formed between the p type high impurity layer 110 and the p type columns 104a in the SJ structure 104 so as to come in contact with those components. The p type deep layer 118 is formed to a position deeper than the trenches 107. In the present embodiment, the p type deep layer 118 is formed from a position deeper than the surface of the p type layer 105 by a predetermined distance. The end of the p type deep layer 118 on the inner peripheral side is arranged on the cell region 101 side of the end P1 on a most outer peripheral side of a contact portion of the front surface electrode 112 with the p type high impurity layer 110. Thus, when viewed from above the semiconductor device, the contact portion of the front surface electrode 112 with the p type high impurity layer 110 overlaps with the p type deep layer 118 by a predetermined width (for example, width of 10 μm) in an inner peripheral direction from the end P1. The p type deep layer 118 is formed to protrude from leading ends of the trenches 107 in the outer peripheral direction by a predetermined amount when viewed from above the semiconductor device.

The p type deep layer 118 has a p type impurity concentration set to be higher than that of at least the respective columns configuring the SJ structure 104, and the p type layer 105 (in more detail, a portion of the p type layer 105 which functions as the resurf layer located in the outer peripheral region 102). The p type deep layer 118 may be set to be lower or higher in the p type impurity concentration than the p type high impurity layer 110.

As described above, the p type deep layer 118 is provided to cover at least corners of the leading ends of the trenches 107 configuring the trench gates. This configuration makes it possible to relax the concentration of an electric field on the trench gate ends in the recovery operation, and suppress the damage of the gate insulating film 108. Why the above advantages are obtained will be described below.

In the recovery operation, the carrier injected in the operation of the MOSFET is drawn from the front surface electrode 112. In this situation, in the structure where the p type deep layer 118 is absent as in the conventional art, as illustrated in FIG. 20, equipotential lines spread along the gate electrode 109 having a gate potential, and an electric field is concentrated inside of or in the vicinity of the gate insulating film 108, in particular, on a corner of each trench 107 at the trench gate leading end. Although not shown in FIG. 20, the electric field is concentrated in the gate insulating film 108. This causes such a problem that the gate insulating film 108 is damaged.

On the contrary, when the p type deep layer 118 is formed as in the present embodiment, the p type deep layer 118 has substantially the same source potential as that of the front surface electrode 112 through the p type high impurity layer 110 when the injected carrier is drawn in the recovery operation. Thus, as illustrated in FIG. 21, the equipotential lines can spread along the p type deep layer 118. As a result, a potential applied into the gate insulating film 108 of the trench gate leading ends covered with the p type deep layer 118 can be reduced to relax the electric field concentration, and the gate insulating film 108 can be restricted from being damaged.

As described above, the p type deep layer 118 is fixed to substantially the source potential in the recovery operation, thereby being capable of restricting the gate insulating film 108 from being damaged. In this case, the p type high impurity layer 110 is more easily maintained at substantially the same potential as that of the front surface electrode 112 through the p type high impurity layer 110 as the p type impurity concentration is higher.

The p type impurity concentration of the p type deep layer 118 is set to be larger than that of at least the p type layer 105 as described above. The p type impurity concentration of the p type deep layer 118 is set to the degree that substantially the source potential is applied to the p type deep layer 118 when the injected carrier is drawn in the recovery operation, and the source potential can be maintained. That is, a lower limit of the p type impurity concentration in the p type deep layer 118 is set so that the p type deep layer 118 is not depleted even if the injected carrier is captured into the p type deep layer 118 in the recovery operation. The upper limit of the p type impurity concentration in the p type deep layer 118 is not limited, and the p type deep layer 118 may have a concentration that can more surely maintain substantially source potential in the recovery operation, and may have the concentration higher than that of the p type high impurity layer 110.

The above advantages are obtained by covering at least the corner of the leading end of each trench 107 with the p type deep layer 118 while bringing the p type deep layer 118 in contact with the p type high impurity layer 110, and also forming the p type deep layer 118 to the position deeper than each trench 107. The magnitude of the above effect changes depending on the positions of the respective ends of the inner and outer peripheries of the p type deep layer 118. Thus, it is preferable to set the positions of the respective ends of the inner and outer peripheries of the p type deep layer 118 on the basis of experimental results which will be described later.

First, a relationship between the position of the end of the p type deep layer 118 on the outer peripheral side and a potential difference ΔV between both surfaces of the gate insulating film 108 at the leading end position of each trench 107 will be described with reference to FIGS. 22 and 23. Both surfaces of the gate insulating film 108 mean an interface of the gate insulating film 108 with the gate electrode 109 and an interface of the gate insulating film 108 with the p type deep layer 118 or the p type layer 105, and the potential difference ΔV represents a potential applied to the gate insulating film 108.

The leading end of each trench 107 can be kept more away from a place to which the electric field is applied as the end of the p type deep layer 118 on the outer peripheral side more protrudes from the leading end of each trench 107 toward the outer peripheral side, which is preferable. Thus, as illustrated in FIG. 22, a distance from the leading end of the trench 107 to the end of the p type deep layer 118 on the outer peripheral side is defined as a protrusion width W1 with reference to the leading end of the trench 107, and a change in the potential difference ΔV to the protrusion width W1 is examined. As described above, because the potential difference ΔV is a potential applied to the gate insulating film 108, the electric field concentration in the gate insulating film 108 can be relaxed more as the potential difference ΔV is smaller, and the gate insulating film 108 is hardly damaged to enable an improvement in the recovery breakdown voltage.

Specifically, with an inverter circuit having the semiconductor devices of the present embodiment in upper and lower arms as a mode, for example, a MOSFET of the semiconductor device on the lower arm side is switched, and the potential difference ΔV of the semiconductor device on the upper arm side at that time is examined. In this case, potentials of the respective components are set assuming a state in which the MOSFET is off in the upper arm. In other words, both of the source potential and the gate potential are set to 0 V, and the drain potential (a potential of an EQR (equipotential ring electrode) in an up drain structure through the rear surface electrode 113 and the EQR not shown) is set to a high voltage (for example, 100 V) to be applied to the inverter circuit. In a sample used for experiment, a distance from the end P1 to the leading end of each trench 107 is set to 9 μm. In order to make the p type deep layer 118 closer to the source potential as much as possible, the end of the p type deep layer 118 on the inner peripheral side is located on the inner peripheral side from the leading end position of the trench 107 by 19 μm. That is, when viewed from above the semiconductor device, an overlap width of the contact portion of the front surface electrode 112 with the p type high impurity layer 110 with the p type deep layer 118 is set to 10 μm.

Figure 23:
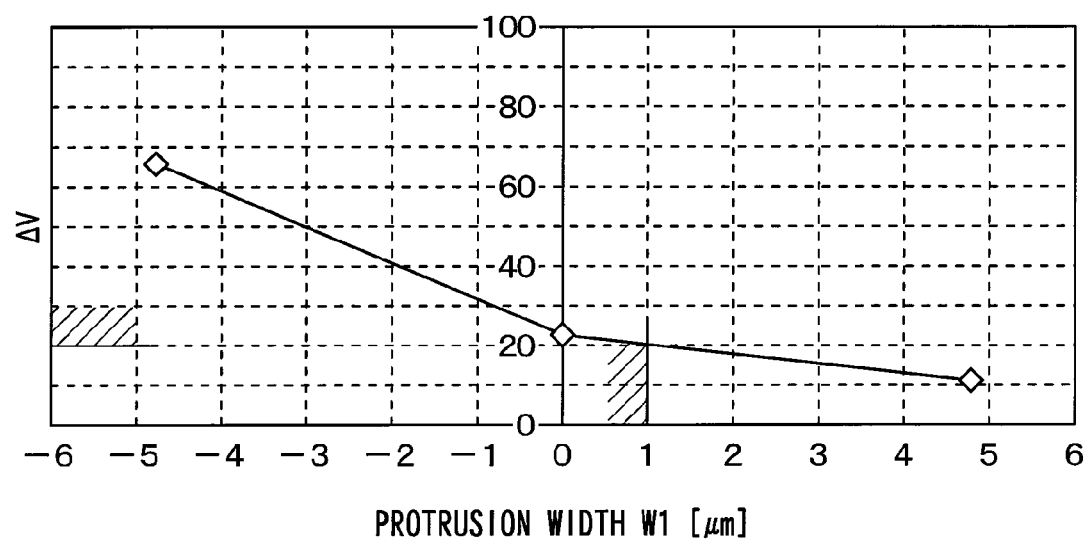
FIG. 23 is a graph showing results obtained by examining a change in a potential difference $\Delta V$ when the protrusion width W1 changes.

FIG. 23 is a graph showing the results. A case in which the end of the p type deep layer 118 on the outer peripheral side protrudes toward the outer peripheral side as compared with the leading end of each trench 107 is represented as positive, and a case in which the end of the p type deep layer 118 on the outer peripheral side is located on the inner peripheral side is represented as negative. In the recovery operation, it is ideal that the potential difference between the p type deep layer 118 and the gate electrode 109 become 0 V because the p type deep layer 118 is fixed to substantially the source potential. However, because an internal resistance is actually present, the potential difference between those components is not 0 V. Thus, the potential difference ΔV is generated even if the p type deep layer 118 is protruded more than the leading end of each trench 107.

As illustrated in FIG. 23, the potential difference ΔV is changed according to the protrusion width W1. When the protrusion width W1 is 0 μm or more, that is, the end of the p type deep layer 118 on the outer peripheral side is present at the same position or is protruded as compared with the leading end of each trench 107, the potential difference ΔV is sufficiently reduced. In particular, when the protrusion width W1 exceeds 1 μm, it is found that the potential difference ΔV becomes 20 V or less, and the potential applied to the gate insulating film 108 can be reduced.

As described above, the end of the p type deep layer 118 on the outer peripheral side is protruded more than the leading end of each trench 107, and the potential applied to the gate insulating film 108 on the trench gate leading end can be reduced more as the protrusion width W1 increases more. As a result, the gate insulating film 108 can be more surely restricted from being damaged.

Figure 24:
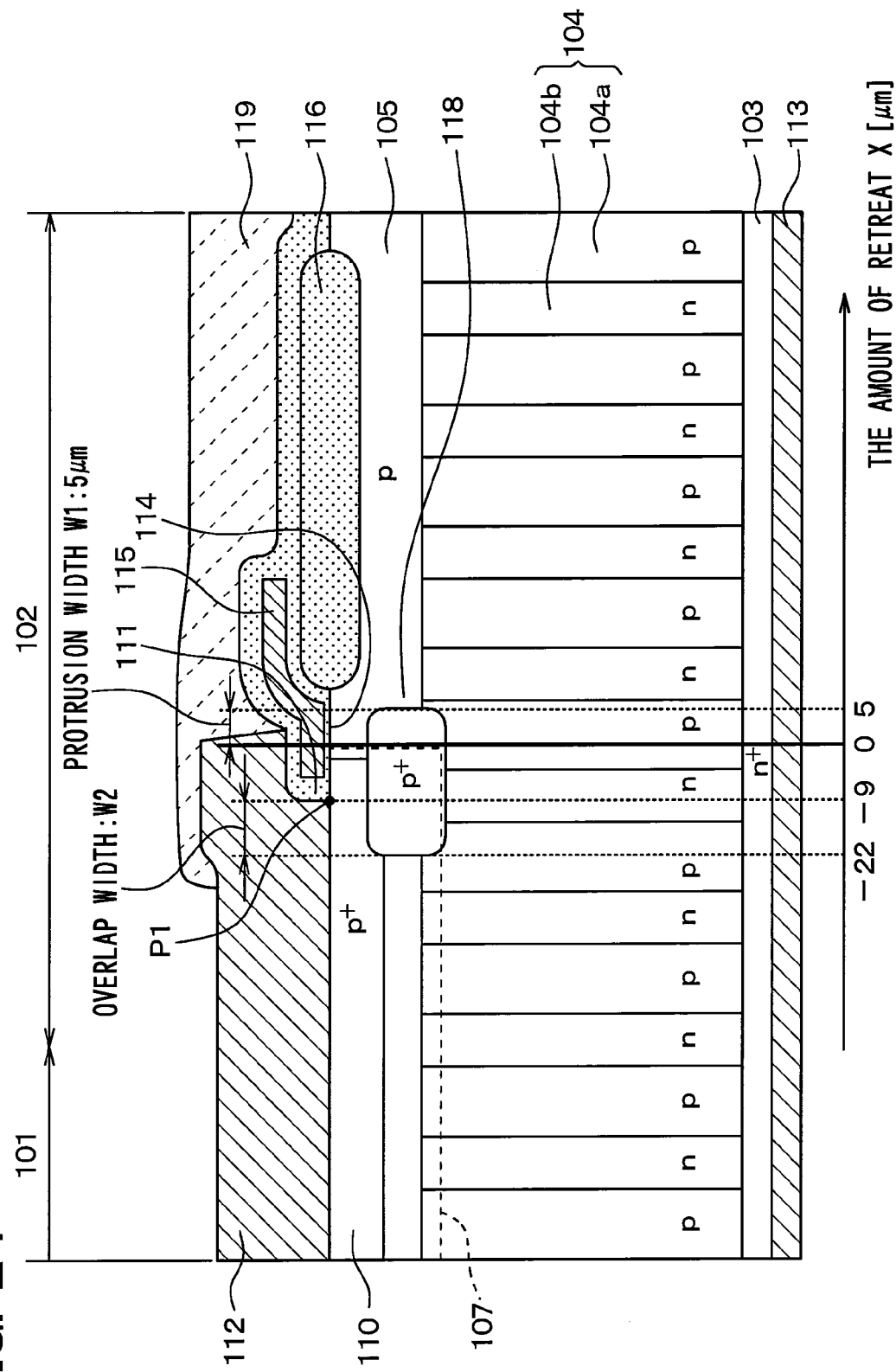
FIG. 24 is a diagram illustrating the amount of retreat X of an end on an inner peripheral side of the p type deep layer from the leading end of the trench in the cross-section shown in FIG. 17.
Figure 25:
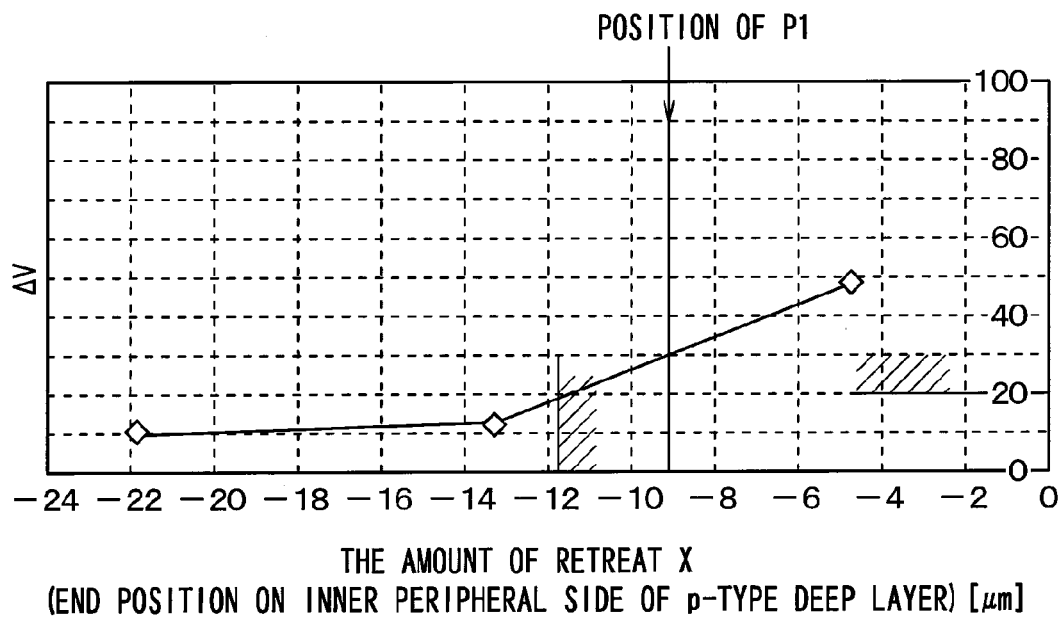
FIG. 25 is a graph showing results obtained by examining a change in a potential difference $\Delta V$ when the amount of retreat X changes.
Figure 26:
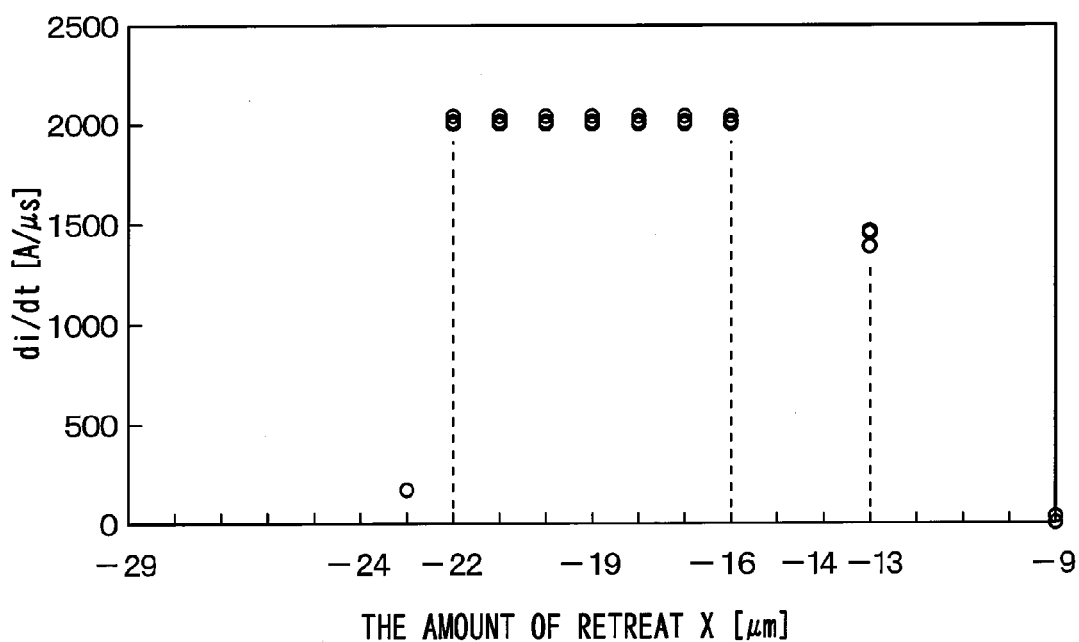
FIG. 26 is a graph showing results obtained by examining the recovery capability to the amount of retreat X by experiment.

Subsequently, a relationship of the position of the end of the p type deep layer 118 on the inner peripheral side, and the potential difference ΔV as well as the recovery capability will be described with reference to FIGS. 24, 25, and 26. FIG. 25 illustrates results obtained by simulation, and FIG. 26 illustrates results obtained by measurement.

In order to maintain the p type deep layer 118 at a potential closer to the source potential in the recovery operation, it is preferable that the p type deep layer 118 is closer to the front surface electrode 112. It is preferable that the internal resistance of the p type high impurity layer 110 in a route between the front surface electrode 112 for maintaining the p type deep layer 118 at the source potential and the p type deep layer 118 is small. Therefore, the end of the p type deep layer 118 on the inner peripheral side is preferably located more inward. Under the circumstances, as illustrated in FIG. 24, the amount of retreat X of the end of the p type deep layer 118 on the inner peripheral side from the leading end of each trench 107 is changed, and a change in the potential difference ΔV is examined. The conditions of the experiment are basically the same as those when the relationship between the position of the end of the p type deep layer 118 on the outer peripheral side and the potential difference ΔV between both surfaces of the gate insulating film 108 at the leading end position of each trench 107 as described above is examined. However, in order to make the gate insulating film 108 surely protectable, the protrusion width W1 of the end of the p type deep layer 118 on the outer peripheral side is fixed to 5 μm, and the potential difference ΔV is examined. FIG. 25 is a graph showing the results. The leading end position of each trench 107 is set to 0, and the amount of retreat X is represented by negative.

As illustrated in FIG. 25, the potential difference ΔV changes depending on the amount of retreat X, and the potential difference ΔV is reduced more as the amount of retreat X is larger. In particular, when the amount of retreat X becomes 12 μm or more, the potential difference ΔV becomes 20 V or less. When the amount of retreat X becomes 22 μm or more, the potential difference ΔV is reduced to about 10 V. In this example, conceivably, the reason that the potential difference ΔV changes depending on the amount of retreat X is because the internal resistance of the p type high impurity layer 110 in the route between the front surface electrode 112 and the p type deep layer 118 becomes reduced. The internal resistance becomes smaller as the p type deep layer 118 comes closer to the front surface electrode 112. The internal resistance becomes smaller as the amount of retreat X of the front surface electrode 112 and the p type deep layer 118 when viewed from above the semiconductor device becomes larger.

According to the experimental results, it is understood that the internal resistance can be reduced to some extent when the amount of retreat X becomes 12 μm or more, and the internal resistance can be sufficiently reduced when the amount of retreat X becomes 13 μm or more. In the sample used for experiment, the distance from the end P1 to the leading end of each trench 107 is set to 9 μm, and a value obtained by subtracting 9 μm from the amount of retreat X becomes an overlap width W2. Therefore, when the overlap width W2 is set to 3 μm or more, preferably, 4 μm or more, the internal resistance can be sufficiently reduced.

As described above, the end of the p type deep layer 118 on the inner peripheral side is retreated to the inner peripheral side of the end P1, and the overlap width W2 increases, thereby being capable of maintaining the p type deep layer 118 at a potential close to the source potential more in the recovery operation. Therefore, the gate insulating film 108 can be more surely restricted from being damaged. When the p type deep layer 118 is brought into contact with the p type high impurity layer 110, the gate insulating film 108 can be protected. In order to make the gate insulating film 108 more sufficiently protectable, it is preferable that the overlap width W2 increases. In particular, when the overlap width W2 is set to 4 μm or more, more preferably, 10 μm or more, because the potential difference ΔV becomes substantially 10 V, the gate insulating film 108 can be more sufficiently protected.

As reference, a relationship between the width of the p type deep layer 118 and the recovery capability is examined. Specifically, as illustrated in FIG. 24, a relationship between the amount of retreat X of the p type deep layer 118 extending from the end of the p type deep layer 118 on the inner peripheral side to the end P1, and the p type high impurity layer 110, and the recovery capability [A/μs] is obtained by experiment. FIG. 26 is a graph showing the results.

As shown in the figure, the recovery capability changes depending on the amount of retreat X. The recovery capability is smaller when the amount of retreat X is smaller. Conceivably, this is because a connection of the p type deep layer 118 to the p type high impurity layer 110 becomes small, and the p type deep layer 118 becomes in a floating state which floats from the potential of the front surface electrode 112 to reduce the effect of relaxing the electric field concentration on the corner of each trench 107 when drawing the injected carrier. That is, when the amount of retreat X is small, and the p type deep layer 118 becomes in the floating state floating from the potential of the front surface electrode 112, a high electric field is applied to the gate oxide film present between the gate electrode and the p type deep layer, and the recovery capability is lowered for dielectric breakdown. On the other hand, when amount of retreat X is 16 to 22 μm, the recovery capability becomes largest, and when the amount of retreat X further increases, the recovery capability is again reduced because a resistance component decreases. In this way, the amount of retreat X has optimum conditions. The experiment is executed under the condition where the dose amount of the p type deep layer 118 is $1 \times 10^{14}$ cm$^{-2}$. The other concentrations also satisfy the above-mentioned relationship between the amount of retreat X and the change in the recovery capability. It is understood that the high recovery capability is obtained when the amount of retreat X falls within a predetermined range. For example, if the recovery capability of 600 A/μs or more is obtained, the amount of retreat X may be set to a range of 13 to 22 μm.

As described above, the amount of retreat X is set to the predetermined range, for example, 13 to 22 μm, thereby being capable of obtaining the high recovery capability. The results illustrated in FIG. 26 suggest that when the recovery capability is lowered with a structure in which the p type deep layer 118 comes in direct contact with the front surface electrode 112. Thus, the p type deep layer 118 is connected to the front surface electrode 112 through the p type high impurity layer 110, to thereby suppress a reduction in the recovery capability.

Subsequently, a description will be given of a method of manufacturing the semiconductor device configured as described above according to the present embodiment with reference to FIGS. 27A to 27G. In the semiconductor device of the present embodiment, the longitudinal direction of the p type columns 104a and the n type columns 104b is perpendicular to the longitudinal direction of the trench gate. In this example, for facilitation to understand the manufacturing method, those directions are arranged in parallel in the illustration.

Figure 27A:
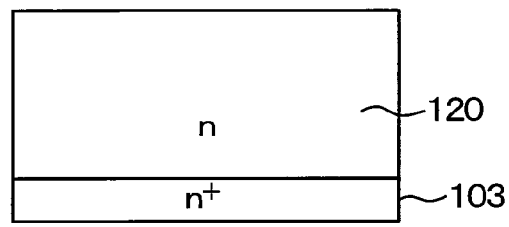
FIG. 27A is a cross-sectional view partially illustrating a process of manufacturing the semiconductor device according to the sixth embodiment.
Figure 27B:
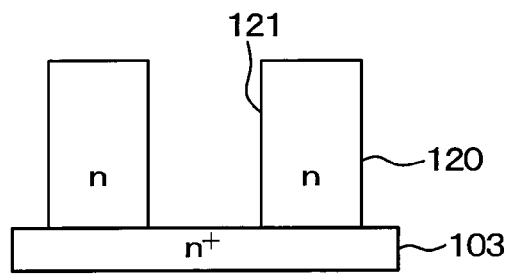
FIG. 27B is a cross-sectional view partially illustrating a process of manufacturing the semiconductor device according to the sixth embodiment.

First, as illustrated in FIG. 27A, after the n$^+$ type substrate 103 having a front surface and a rear surface is prepared, an n type epitaxial layer 120 is formed on the surface of the n$^+$ type substrate 103. Subsequently, the n type epitaxial layer 120 is etched using an etching mask in which positions where the p type columns 104a not shown are to be formed are opened. As a result, as illustrated in FIG. 27B, only positions of the n type epitaxial layer 120 where the n type columns 104b are to be formed remain, and trenches 121 are formed at the positions where the p type columns 104a are to be formed. In this situation, the n type epitaxial layer 120 may be etched so that a depth of the trenches 121 becomes as large as a thickness of the n type epitaxial layer 120.

Alternatively, the depth of the trenches 121 may be set so that a desired thickness of the n type epitaxial layer 120 remains.

Figure 27C:
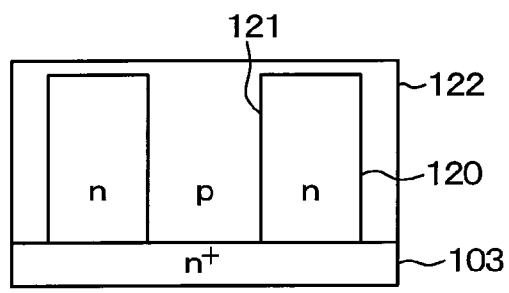
FIG. 27C is a cross-sectional view partially illustrating a process of manufacturing the semiconductor device according to the sixth embodiment.
Figure 27D:
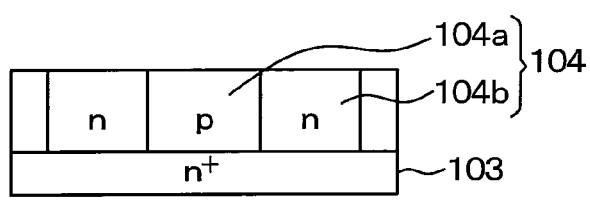
FIG. 27D is a cross-sectional view partially illustrating a process of manufacturing the semiconductor device according to the sixth embodiment.

Subsequently, as illustrated in FIG. 27C, a p type epitaxial layer 122 is formed on the n type epitaxial layer 120 so as to be embedded in the trenches 121. Further, as illustrated in FIG. 27D, planarization polishing is performed to remove the n type epitaxial layer 120 and the p type epitaxial layer 122 by a predetermined amount. As a result, the n type columns 104b are configured by the n type epitaxial layer 120, and the p type columns 104a are configured by the p type epitaxial layer 122 to complete the SJ structure 104.

Figure 27E:
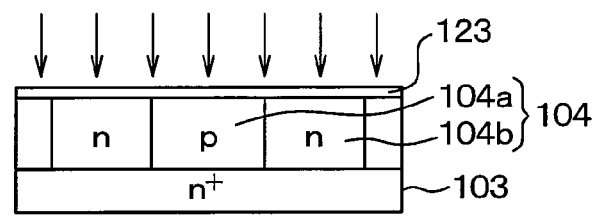
FIG. 27E is a cross-sectional view partially illustrating a process of manufacturing the semiconductor device according to the sixth embodiment.
Figure 27F:
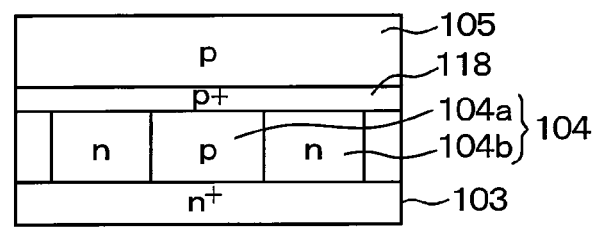
FIG. 27F is a cross-sectional view partially illustrating a process of manufacturing the semiconductor device according to the sixth embodiment.

Further, after a mask not shown in which a position where the p type deep layer 118 is to be formed is opened is arranged through a photography process, a p type impurity is ion-implanted using that mask. As a result, as illustrated in FIG. 27E, an impurity implantation layer 123 for forming the p type deep layer 118 is formed on surfaces of the p type columns 104a and the n type columns 104b. Further, as illustrated in FIG. 27F, after the p type layer 105 epitaxially grows, and a heat treatment is performed to thermally diffuse the p type impurity in the impurity implantation layer 123 to form the p type deep layer 118 extending from the surface layer portions of the p type columns 104a and the n type columns 104b into the p type layer 105.

Figure 27G:
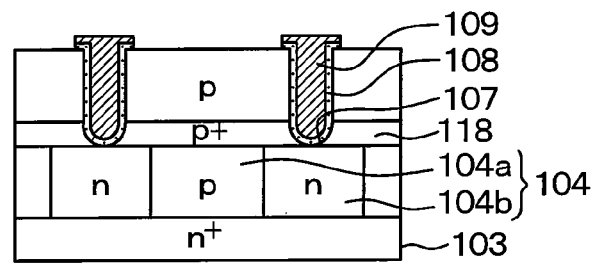
FIG. 27G is a cross-sectional view partially illustrating a process of manufacturing the semiconductor device according to the sixth embodiment.

Thereafter, as illustrated in FIG. 27G, a semiconductor device having trench gate MOSFETs of the SJ structure is completed through the same manufacturing process of the MOSFETs as the conventional process.

As described above, the p type deep layer 118 is formed to come in contact with the p type high impurity layer 110, and also to cover at least the corner of the leading end of each trench 107 protruding to the outer edge of the front surface electrode 112. The p type impurity concentration of the p type deep layer 118 is set to be higher than the p type layer 105. Thus, the p type deep layer 118 has substantially the same source potential as that of the front surface electrode 112 through the p type high impurity layer 110 when the injected carrier is drawn in the recovery operation. Thus, the equipotential lines can spread along the p type deep layer 118. As a result, a potential applied into the gate insulating film 108 of the trench gate leading ends covered with the p type deep layer 118 can be reduced to relax the electric field concentration, and the gate insulating film 108 can be restricted from being damaged.

The invention disclosed in the above-mentioned PTL 2 has a structure in which a p⁺ type layer is provided only in the surface layer portion of the p type columns. In the case of the above structure, in the SJ structure in which the p type columns and the n type columns are repeated, the surface layer portion of the p type columns becomes higher in the impurity concentration than the n type columns, and the charge balance is lost to cause a reduction in the breakdown voltage. That is, a depletion layer spread to the n type column side sandwiched between the p⁺ type layers, and the depletion layer does not spread to the p⁺ type layer side. The depletion of the overall region is not performed, resulting in a reduction in the breakdown voltage.

On the contrary, when the p type deep layer 118 is provided in the surface layer portions of not only the p type columns 104a but also the n type columns 104b as in the present embodiment, the SJ structure 104 is not configured, but the p type deep layer 118 is formed on the SJ structure 104 in the above region. Thus, the SJ structure 104 is merely partially shallow at the position where the p type deep layer 118 is formed, which is not a region where the breakdown voltage is affected. Therefore, the breakdown voltage can be improved by forming the p type deep layer 118 over the p type columns 104a and the n type columns 104b as in the present embodiment.

Seventh Embodiment

A seventh embodiment of the present disclosure will be described. In the present embodiment, the method of manufacturing the semiconductor device is changed as compared with the sixth embodiment, and other configurations are identical with those in the sixth embodiment. Therefore, only parts different from those in the sixth embodiment will be described.

Figure 28A:
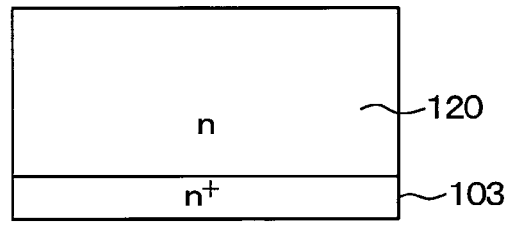
FIG. 28A is a cross-sectional view partially illustrating a process of manufacturing the semiconductor device according to a seventh embodiment of the present disclosure.
Figure 28B:
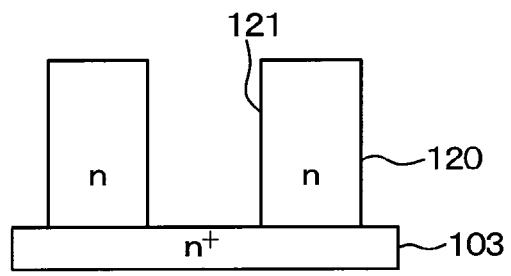
FIG. 28B is a cross-sectional view partially illustrating a process of manufacturing the semiconductor device according to the seventh embodiment.
Figure 28C:
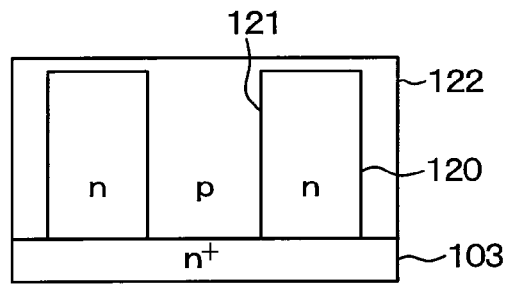
FIG. 28C is a cross-sectional view partially illustrating a process of manufacturing the semiconductor device according to the seventh embodiment.
Figure 28D:
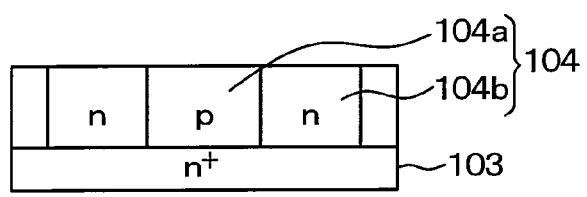
FIG. 28D is a cross-sectional view partially illustrating a process of manufacturing the semiconductor device according to the seventh embodiment.
Figure 28E:
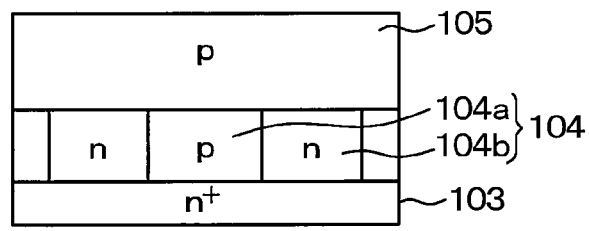
FIG. 28E is a cross-sectional view partially illustrating a process of manufacturing the semiconductor device according to the seventh embodiment.
Figure 28F:
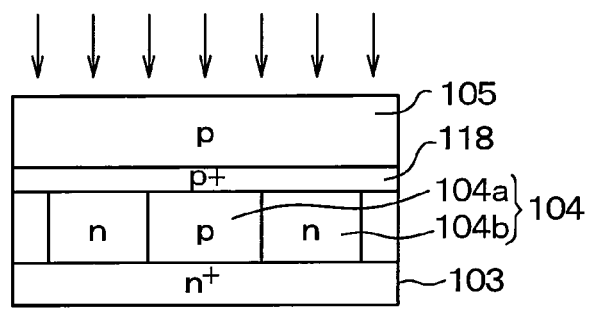
FIG. 28F is a cross-sectional view partially illustrating a process of manufacturing the semiconductor device according to the seventh embodiment.
Figure 28G:
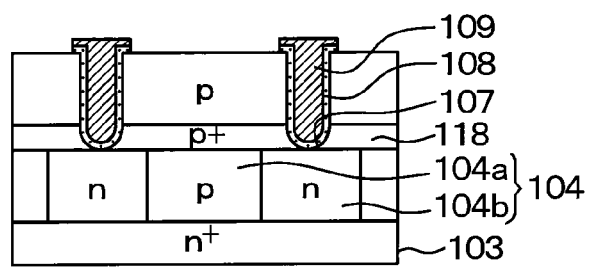
FIG. 28G is a cross-sectional view partially illustrating a process of manufacturing the semiconductor device according to the seventh embodiment.

A method of manufacturing the semiconductor device according to the present embodiment will be described with reference to FIGS. 28A to 28G. First, in processes illustrated in FIGS. 28A to 28D, the same processes as those in FIGS. 27A to 27D described in the sixth embodiment are performed. Further, in the process illustrated in FIG. 28E, the p type layer 105 epitaxially grows on the SJ structure 104 before ion implantation of the p type impurity for forming the p type deep layer 118. Thereafter, after a mask not shown in which a position where the p type deep layer 118 is to be formed is opened is arranged through a photography process, a p type impurity is implanted from above the p type layer 105 by high acceleration ion implantation using that mask. With the above process, the p type deep layer 118 is formed as illustrated in FIG. 28F. Thereafter, as illustrated in FIG. 28G, a semiconductor device having trench gate MOSFETs of the SJ structure is completed through the same manufacturing process of the MOSFETs as the conventional process.

As described above, the p type layer 105 epitaxially grows before ion implantation of the p type impurity for forming the p type deep layer 118, and thereafter the p type deep layer 118 can be formed by the high acceleration ion implantation. In the manufacturing method as described above, as compared with the sixth embodiment, because a device for performing the high acceleration ion implantation is required, the simplification of the manufacturing process attributable to the absence of the high acceleration ion implantation as in the sixth embodiment cannot be performed. However, because no epitaxial growth is conducted on the surface where a crystal defect occurs due to the ion implantation as in the sixth embodiment, the resurf layer more excellent in crystalline can be obtained.

In the manufacturing method, the p type deep layer 118 can be formed from the surface of the p type layer 105. As described above, if the p type deep layer 118 is formed from the surface of the p type layer 105, because the overall region of the leading ends of the trenches 107 can be covered with the p type deep layer 118, the gate insulating film 108 can be more protected.

Eighth Embodiment

An eighth embodiment of the present disclosure will be described. In the present embodiment, a top layout of the p type deep layer 118 changes in the sixth embodiment, and other configurations are identical with those in the sixth embodiment. Therefore, only portions different from those in the sixth embodiment will be described.

Figure 29:
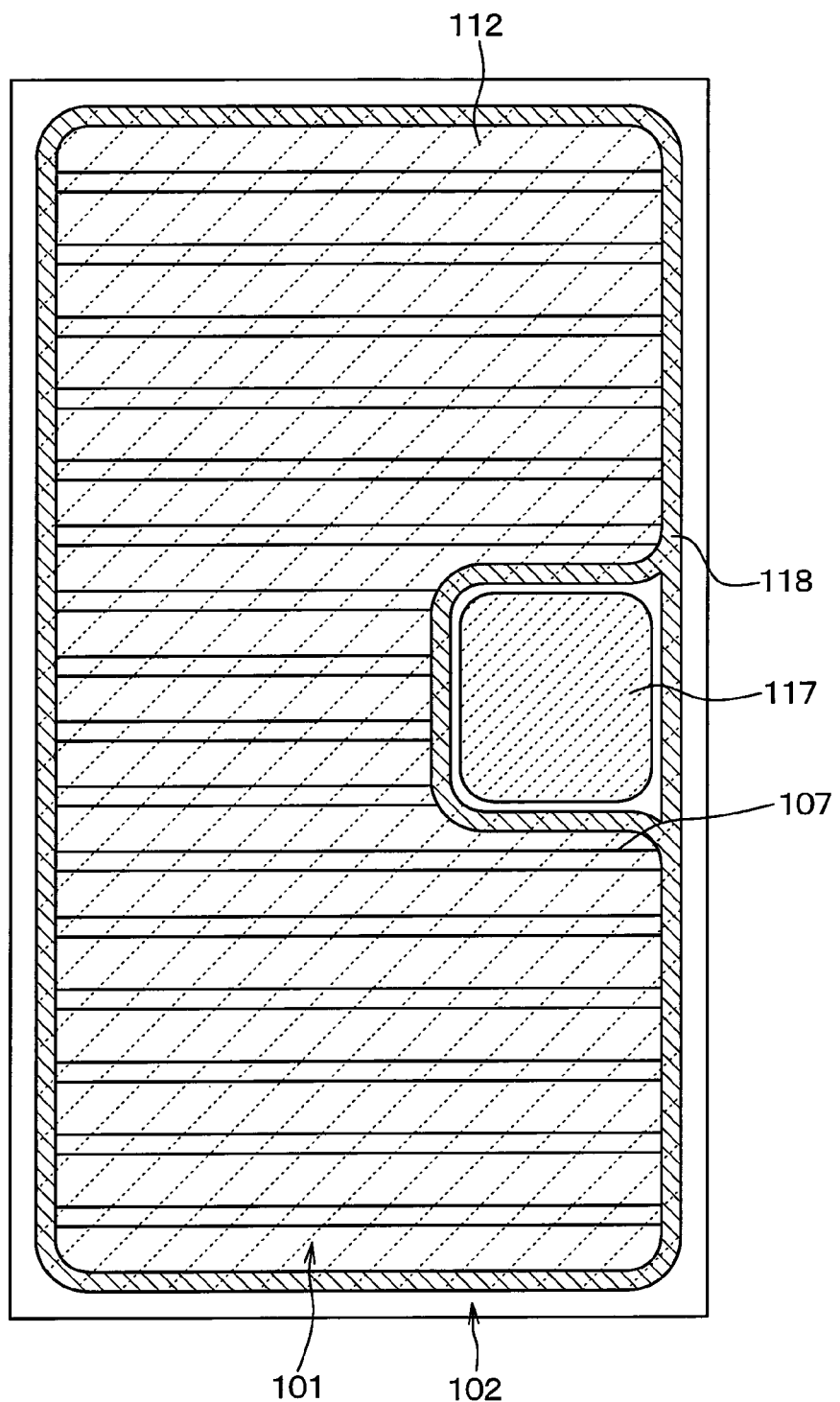
FIG. 29 is a diagram partially illustrating a top layout of a semiconductor device according to an eighth embodiment of the present disclosure.

The configuration of the semiconductor device according to the present embodiment will be described with reference to FIG. 29. As illustrated in the figure, in the present embodiment, a p type deep layer 118 is formed around an outer edge of a front surface electrode 112. That is, since the leading ends of plural trenches 107 are arranged along the outer edge of the front surface electrode 112, the p type deep layers 118 arranged on the leading ends of the respective trenches 107 are coupled with each other to surround the outer edge of the front surface electrode 112. In this way, the p type deep layer 118 is not formed into the dot shape on only the respective trench gate leading ends, but may be formed around the outer edge of the front surface electrode 112. When the p type deep layer 118 is formed around the outer peripheral portion of the front surface electrode 112 as described above, the p type deep layer 118 can be arranged on the overall region of a boundary portion between a region in which the MOSFETs are configured in the cell region 101 and the outer peripheral region 102. Accordingly, the potential of the outer edge can be maintained at substantially the source potential in the overall region where the MOSFETs are configured in the cell region 101.

In the present embodiment, the p type deep layer 118 is formed around the outer edge of the front surface electrode 112. In addition, the p type deep layer 118 is also formed on an outer edge of a side of the gate pad 117 which does not face the front surface electrode 112. In other words, the p type deep layer 118 is formed around the outer edge of the gate pad 117 when viewed from above the semiconductor device. With the above configuration, the potential of the outer edge can be maintained at substantially the source potential in not only the region where the MOSFETs are configured in the cell region 101, but also the outer edge of a portion in which the gate pad 117 is configured.

Ninth Embodiment

A ninth embodiment of the present disclosure will be described. In the present embodiment, a relationship between the layout of the SJ structure 104 and the layout of the MOSFET changes in the sixth to eighth embodiments, and other configurations are identical with those in the sixth to eighth embodiments. Therefore, only portions different from those in the sixth to eighth embodiments will be described.

Figure 30:
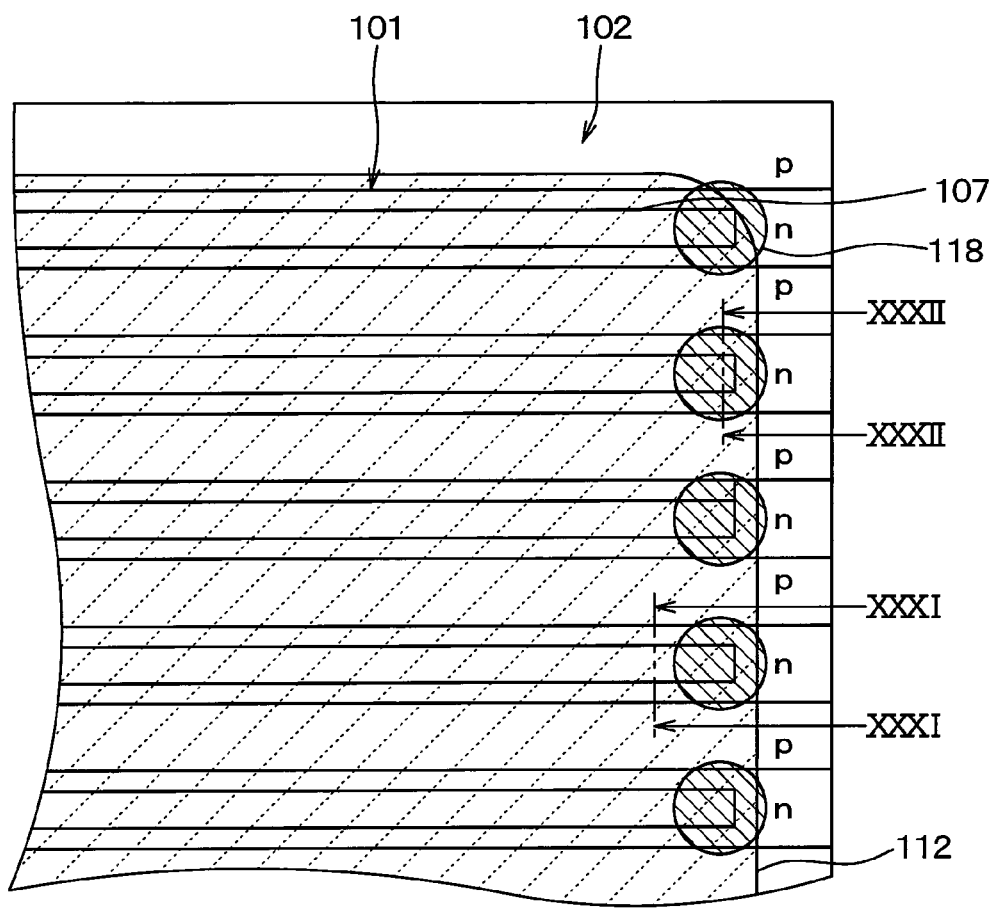
FIG. 30 is a top layout view of a semiconductor device having a MOSFET of an SJ structure according to a ninth embodiment of the present disclosure.
Figure 31:
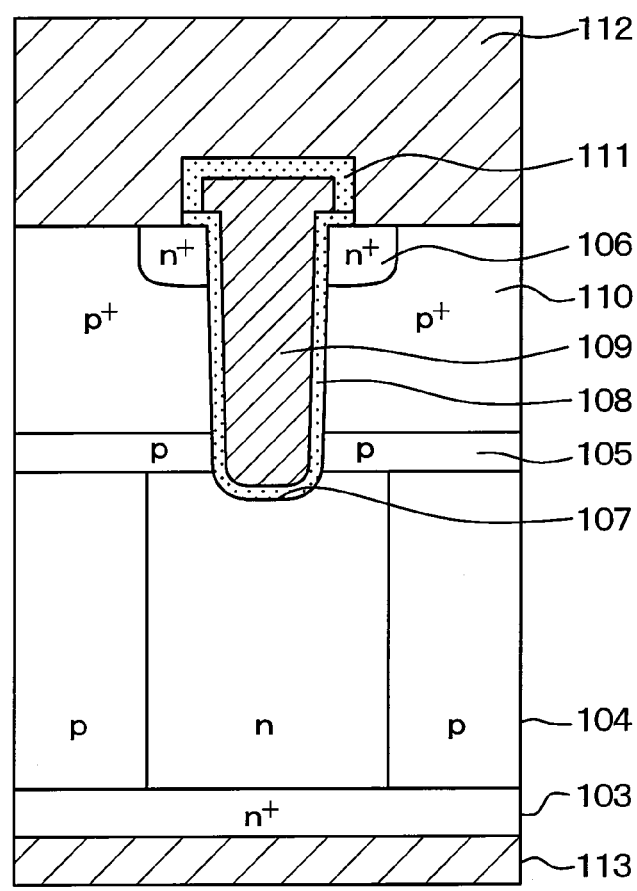
FIG. 31 is a cross-sectional view of the semiconductor device taken along a line XXXI-XXXI shown in FIG. 30.
Figure 32:
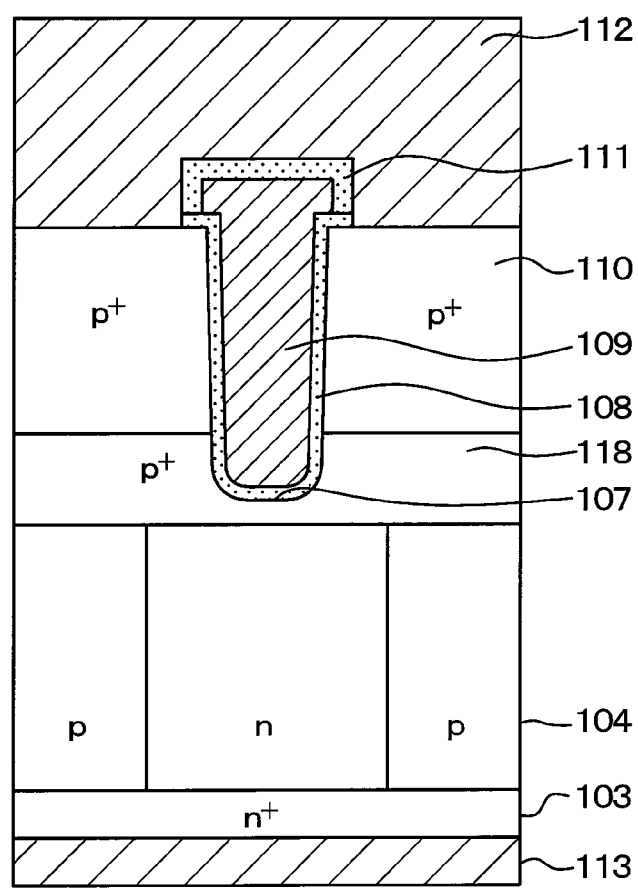
FIG. 32 is a cross-sectional view of the semiconductor device taken along a line XXXII-XXXII shown in FIG. 30.
Figure 33:
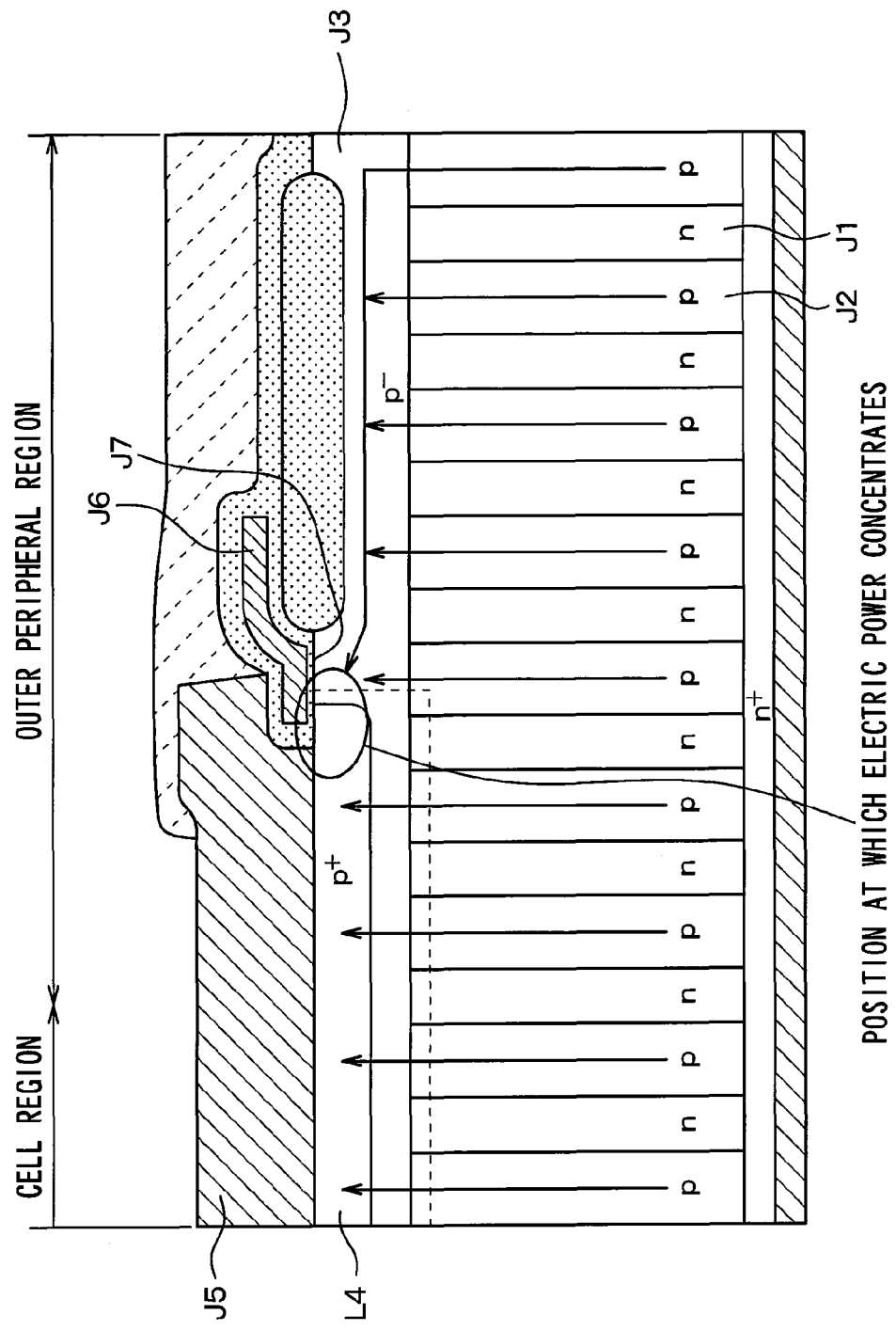
FIG. 33 is a cross-sectional view of the semiconductor device illustrating a state in which injected charge transfers in recovery operation.

The semiconductor device according to the present embodiment will be described with reference to FIGS. 30 to 32. As illustrated in those figures, in the present embodiment, the trenches 107 are aligned in parallel to the longitudinal direction of the p type columns 104a and the n type columns 104b in the SJ structure 104. Specifically, the trenches 107 are arranged at positions corresponding to the n type columns 104b, and a channel formed in the p type layer 105 when the MOSFETs turn on is connected to the n type columns 104b.

As described above, the longitudinal direction of the trench gates may be identical with the longitudinal directions of the p type columns 104a and the n type columns 104b. Even with the above configuration, the p type deep layer 118 is formed on at least the trench gate leading ends, thereby being capable of obtaining the same advantages as those in the sixth to eighth embodiments.

Other Embodiments

The present disclosure is not limited to the above embodiments, but can appropriately change within the scope described in the appended claims.

For example, in the first to third embodiments, the MOSFETs are exemplified by the trench gate type, but may be of a planar type. In that case, the p type layer 5 is not formed on the overall surface by epitaxial growth, but the p type layer 5 may be formed by epitaxially growing the n type layer, and ion-implanting the p type impurity into a required portion. Specifically, the p type impurity may be ion-implanted in a body region where the channel is formed in the cell region 1, and a region forming the resurf layer in the outer peripheral region 2 to form the p type layer 5.

In the above first embodiment, the layout of the front surface electrode 12 forming the source electrode and the gate pad 17 is exemplified, but other layouts may be applied. For example, a structure may be applied in which the gate pad 17 is arranged in the center of the front surface electrode 12, and a lead wire extending from the outer peripheral side of the front surface electrode 12 toward the gate pad 17 is disposed. In that case, an arrangement space of a lead wire from the gate pad 17 is provided, and the front surface electrode 12 is laid out. Even in such a case, the p type deep layer 18 may be formed along the boundary between the gate pad 17 or the lead wire and the front surface electrode 12.

In the above first to third embodiments, the longitudinal direction of the trenches 7 is perpendicular to the longitudinal directions of the p type columns 4a and the n type columns 4b, but may be in parallel to each other. That is, the longitudinal direction of the gate electrode 9 may be identical with the longitudinal directions of the p type columns 4a and the n type columns 4b. In that case, the trenches 7 may be formed in the n type columns 4b. It is needless to say that even when the MOSFETs have the planar type, the longitudinal direction of the gate electrode 9 may be identical with the longitudinal directions of the p type columns 4a and the n type columns 4b.

In the above first to third embodiments, the SJ structure 4 has a trench epitaxial system, but may be of a lamination epitaxial system. For example, a process in which after a part of the n type epitaxial layer 22 has been formed, the p type impurity is ion-implanted to form a part of the p type columns 4a may be repeated to form the PN columns.

The p type layer 5 configuring the resurf layer is formed by epitaxial growth, but may be formed by ion implantation and diffusion. Further, in order to configure the resurf layer, the p type layer 5 is formed on the SJ structure 4 as the semiconductor layer. However, because the resurf layer is not essential, not the p type layer 5 but an n type layer can be formed as the semiconductor layer.

In the above first to fifth embodiments, the PN columns may be of a repetitive structure in which the p type columns 4a and the n type columns 4b are repeated in parallel to the surface of the semiconductor substrate 3. Alternatively, the p type columns 4a may be formed into a dot shape in the n type columns 4b.

Also, in the above first to fifth embodiments, the p type deep layer 18 is formed around the outer edge of the front surface electrode 12. However, the p type deep layer 18 does not always need to surround the outer edge of the front surface electrode 12.

Further, in the above fifth embodiment, a case in which the gate pad 17 is arranged in the center of the cell region 1 is described as an example of the structure in which the p type high impurity layer 10 is divided. Alternatively, another p type high impurity layer 10 may be divided. That is, in the structure in which the p type high impurity layer 10 is divided when viewed from the substrate normal direction, the p type deep layer 18 is provided in the divided portion, thereby being capable of suppressing a reduction in the recovery capability even in another structure. For example, in the structure in which the p type high impurity layer 10 is merely divided by an LOCOS oxide film, the p type deep layer 18 may be disposed in the portion where the p type high impurity layer 10 is divided.

In the above sixth embodiment, the layout of the front surface electrode 112 forming the source electrode and the gate pad 117 is exemplified, but other layouts may be applied. For example, a structure may be applied in which the gate pad 117 is arranged in the center of the front surface electrode 112, and a lead wire extending from the outer peripheral side of the front surface electrode 112 toward the gate pad 117 is disposed.

In the sixth to ninth embodiments, the p type layer 105 is formed in not only the outer peripheral region 102, but also the cell region 101, and not only the resurf layer of the outer peripheral region 102, but also the base layer of the cell region 101 are configured by the p type layer 105. However, the resurf layer or the base layer does not always need to be configured by only the p type layer 105, and the p type layer 105 does not need to be formed on the overall surface of the SJ structure 104. For example, an n type layer is formed on the SJ structure 104 in advance, and the p type impurity may be ion-implanted into the n type layer to configure the resurf layer and the base layer.

In the above sixth to eighth embodiments, the SJ structure 104 has a trench epitaxial system, but may have a lamination epitaxial system. For example, a process in which after a part of the p type epitaxial layer 122 has been formed, the p type impurity is ion-implanted to form a part of the p type columns 104a may be repeated to form the PN columns.

In the above sixth embodiment, as illustrated in FIG. 27, after the impurity implantation layer 123 has been formed, the p type layer 105 is epitaxially grown, and the p type impurity layer in the impurity implantation layer 123 is thermally diffused to form the p type deep layer 118. In this example, it is assumed that a heat treatment is performed to the extent that the p type deep layer 118 is spaced apart from the surface of the p type layer 105. However, the p type deep layer 118 can be formed from the surface of the p type layer 105 by controlling a temperature and a time for the heat treatment.

The p type layer 105 configuring the resurf layer is formed by epitaxial growth, but may be formed by ion implantation and diffusion. Further, in order to configure the resurf layer, the p type layer 105 is formed on the SJ structure 104 as the semiconductor layer. However, because the resurf layer is not essential, not the p type layer 105 but an n type layer can be formed as the semiconductor layer.

In the above sixth to eighth embodiments, the PN columns may have a repetitive structure in which the p type columns 104a and the n type columns 104b are repeated in parallel to the surface of the semiconductor substrate 103. Alternatively, the p type columns 104a may be formed into a dot shape in the n type columns 104b.

In the first to third embodiments and the sixth to ninth embodiments, the semiconductor device including the MOSFETs of the n-channel type in which the first conductivity type is n type and the second conductivity type is p type has been exemplified. However, the present disclosure can be applied to the semiconductor device including the MOSFETs of the p-channel type in which the conductivity type of the respective components is inverted.

The invention claimed is:

1. A semiconductor device comprising:
   a semiconductor substrate of a first conductivity type having a front surface and a rear surface;
   a super junction structure having a repetitive structure in which first conductivity type columns and second conductivity type columns are repeated in parallel to a surface of the semiconductor substrate, on a front surface side of the semiconductor substrate;
   a semiconductor layer formed on the super junction structure in a cell region and in an outer peripheral region surrounding the cell region, the outer peripheral region of the semiconductor layer corresponding to an outer peripheral side of the semiconductor substrate including a vertical semiconductor element formed inside the outer peripheral region;
   a high impurity layer of a second conductivity type formed in the semiconductor layer on the super junction structure in the cell region, and having an impurity concentration higher than an impurity concentration of the semiconductor layer;
   a front surface electrode formed to enter the outer peripheral region from the cell region, and formed in contact with the high impurity layer;
   a rear surface electrode electrically connected to a rear surface side of the semiconductor substrate; and
   a deep layer of the second conductivity type having an impurity concentration higher than an impurity concentration of the super junction structure, not depleted, and extending from a position having a predetermined depth from a surface of the semiconductor layer and extending around an outer edge of the front surface electrode when viewed from a substrate normal direction,
   wherein the deep layer contacts each of the high impurity layer, the semiconductor layer and the super junction structure, and is completely surrounded by a combination of the high impurity layer, the semiconductor layer and the super junction structure when viewed from the substrate normal direction, and
   wherein the deep layer has an overlapping portion extending between a first end of a portion of the front surface electrode which comes in contact with the high impurity layer on a most outer peripheral side and an end of the high impurity layer on the outer peripheral side when viewed from the substrate normal direction.

2. The semiconductor device according to claim 1, wherein the semiconductor layer is a second conductivity type layer configuring a resurf layer in the outer peripheral region.

3. The semiconductor device according to claim 1, wherein the deep layer is formed around an outer edge of the front surface electrode.

4. The semiconductor device according to claim 1, wherein the deep layer is lower in impurity concentration than the high impurity layer.

5. The semiconductor device according to claim 1, wherein a second conductivity type impurity concentration of the deep layer is $1\times10^{17}$ cm$^3$ or more.

6. The semiconductor device according to claim 1, wherein a center depth from a surface of the semiconductor layer in the deep layer is 2 μm or more.

7. The semiconductor device according to claim 1, wherein
   the vertical semiconductor element is a MOSFET with the front surface electrode as a source electrode and the rear surface electrode as a drain electrode,
   in the cell region, a gate electrode extending in one direction parallel to the surface of the semiconductor substrate as a longitudinal direction is provided, and a source region of the first conductivity type which comes in contact with the front surface electrode is formed in the same direction as that of the gate electrode as a longitudinal direction, and in the outer peripheral region, a gate line layer that is connected to the gate electrode is disposed on the high impurity layer and the super junction structure on an outer peripheral side of the first end.

8. The semiconductor device according to claim 6, wherein
an end of the outer peripheral side in the deep layer is arranged inside of any one end located on an outermost peripheral side of an end on an outermost peripheral side of the front surface electrode and an end on an outermost peripheral side of a gate pad connected to a gate line layer.

9. The semiconductor device according to claim 8, wherein
the front surface electrode and the gate pad are spaced at a predetermined distance from each other, and
the deep layer is formed along a boundary between the front surface electrode and the gate pad when viewed from the substrate normal direction.

10. The semiconductor device according to claim 8, wherein
the deep layer is formed around an outer edge of the gate pad when viewed from the substrate normal direction.

11. The semiconductor device according to claim 1, wherein
the vertical semiconductor element is a diode having the front surface electrode as an anode electrode and the rear surface electrode as a cathode electrode, and
the high impurity layer is formed as an anode contact in the cell region.

12. The semiconductor device according to claim 1, wherein
an end of the outer peripheral side in the deep layer is located on an inner peripheral side of the first end by 4 μm to 13 μm.

13. The semiconductor device according to claim 1, wherein
the high impurity layer is divided in a planar direction of the semiconductor substrate, and the deep layer is formed on a divided portion.

14. A method of manufacturing the semiconductor device according to claim 1, comprising:
preparing the semiconductor substrate;
forming the super junction structure having the first conductivity type columns and the second conductivity type columns on a front surface side of the semiconductor substrate;
forming an impurity implantation layer in a surface layer portion of the super junction structure by ion-implanting a second conductivity type impurity using a mask in which a region where the deep layer is to be formed is opened; and
forming the deep layer by epitaxially growing the second conductivity type layer on a surface of the super junction structure in which the impurity implantation layer is formed, and thermally diffusing the impurity within the impurity implantation layer through a heat treatment.

15. A method of manufacturing the semiconductor device according to claim 1, comprising:
preparing the semiconductor substrate;
forming the super junction structure having the first conductivity type columns and the second conductivity type columns on the front surface side of the semiconductor substrate;
forming a second conductivity type layer on a surface of the super junction structure; and
forming the deep layer by conducting ion implantation with a second conductivity type impurity from above the second conductivity type layer using a mask in which a region where the deep layer is to be formed is opened, the ion implantation being conducted at an acceleration effective for forming the deep layer of the second conductivity type with the impurity concentration higher than the impurity concentration of the super junction structure.

16. A semiconductor device comprising:
a semiconductor substrate of a first conductivity type having a front surface and a rear surface;
a super junction structure having a repetitive structure in which first conductivity type columns and second conductivity type columns are repeated in a direction parallel to a surface of the semiconductor substrate, on a front surface side of the semiconductor substrate;
a semiconductor layer formed on the super junction structure in a cell region and in an outer peripheral region surrounding the cell region, the outer peripheral region of the semiconductor layer corresponding to an outer peripheral side of the semiconductor substrate including a vertical semiconductor element formed inside the outer peripheral region;
a source region of a first conductivity type formed on a surface layer portion of the semiconductor layer in the cell region;
a trench reaching the first conductivity type columns through the source region and the semiconductor layer, and extending from the cell region toward the outer peripheral region with one direction as a longitudinal direction;
a gate insulating film formed on a surface of the trench;
a gate electrode formed on a surface of the gate insulating film in the trench;
a high impurity layer of a second conductivity type formed in the semiconductor layer in the cell region, and having an impurity concentration higher than an impurity concentration of the super junction structure;
a front surface electrode configuring a source electrode that is formed to enter the outer peripheral region from the cell region, and formed in contact with the high impurity layer and the source region;
a rear surface electrode configuring a drain electrode electrically connected to a rear surface side of the semiconductor substrate; and
a deep layer of a second conductivity type being in contact with the high impurity layer, having a higher impurity concentration than that of the super junction structure, covering at least a corner of a leading end of the trench in a longitudinal direction of the trench, and protruding toward an outer peripheral side of the leading end of the trench when viewed from a substrate normal direction, wherein
the deep layer is separated from the surface of the semiconductor layer;
an end of an innermost peripheral side of the deep layer extends toward the cell region from a first end on an outermost peripheral side of the front surface electrode in a contact portion with the high impurity layer,
the contact portion of the front surface electrode with the high impurity layer overlaps with the deep layer by a predetermined width in the inner peripheral direction from the first end of the front surface electrode when viewed from the substrate normal direction,
the deep layer contacts each of the high impurity layer, the semiconductor layer and the super junction structure, and is completely surrounded by a combination of the high impurity layer, the semiconductor layer and the super junction structure when viewed from the substrate normal direction, and the deep layer overlaps a portion between the first end of a portion of the front electrode and an end of the high impurity layer.

17. The semiconductor device according to claim 16, wherein a plurality of the trenches is aligned in the cell region, leading ends of the plurality of trenches are arranged along an outer edge of the front surface electrode, and the deep layer is arranged around an outer edge portion of the front surface electrode.

18. The semiconductor device according to claim 16, wherein a plurality of the trenches is aligned in the cell region, and the deep layer is formed in a dot shape in each of leading ends of the plurality of trenches.

19. The semiconductor device according to claim 16, wherein the deep layer is formed from a position deeper than the surface of the semiconductor layer by a predetermined distance.

20. The semiconductor device according to claim 16, wherein the deep layer is formed from a surface of the semiconductor layer.

21. The semiconductor device according to claim 16, wherein the semiconductor layer includes:

a resurf layer of the second conductivity type formed on the super junction structure in the outer peripheral region; and a base layer of the second conductivity type formed on the super junction structure in the cell region.

22. A method of manufacturing the semiconductor device according to claim 16, comprising:

preparing the semiconductor substrate;

forming the super junction structure having the first conductivity type columns and the second conductivity type columns on the front surface side of the semiconductor substrate;

forming an impurity implantation layer in a surface layer portion of the super junction structure by ion-implanting a second conductivity type impurity using a mask in which a region where the deep layer is to be formed is opened; and forming the deep layer by epitaxially growing the semiconductor layer on a surface of the super junction structure in which the impurity implantation layer is formed, and thermally diffusing the impurity within the impurity implantation layer through a heat treatment.

23. A method of manufacturing the semiconductor device according to claim 16, comprising:

preparing the semiconductor substrate;

forming the super junction structure having the first conductivity type columns and the second conductivity type columns on the front surface side of the semiconductor substrate;

forming the semiconductor layer on a surface of the super junction structure; and forming the deep layer by conducting high acceleration ion implantation with a second conductivity type impurity from above a second conductivity type layer using a mask in which a region where the deep layer is to be formed is opened.

* * * * *